(12) United States Patent
Nakazawa

(10) Patent No.: US 8,482,954 B2
(45) Date of Patent: Jul. 9, 2013

(54) SEMICONDUCTOR MEMORY AND METHOD FOR OPERATING THE SEMICONDUCTOR MEMORY

(75) Inventor: Mitsuharu Nakazawa, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 117 days.

(21) Appl. No.: 13/224,158

(22) Filed: Sep. 1, 2011

(65) Prior Publication Data

US 2011/0317507 A1 Dec. 29, 2011

Related U.S. Application Data

(63) Continuation of application No. PCT/JP2009/000982, filed on Mar. 4, 2009.

(51) Int. Cl.
G11C 11/22 (2006.01)
G11C 8/00 (2006.01)

(52) U.S. Cl.
USPC .................. 365/145; 365/230.06; 365/230.08

(58) Field of Classification Search
USPC ........................................... 365/145
See application file for complete search history.

(56) References Cited

U.S. PATENT DOCUMENTS

| 6,097,622 | A | 8/2000 | Shimizu et al. | |
|---|---|---|---|---|
| 7,313,011 | B2 * | 12/2007 | Jeon et al. | 365/145 |
| 7,616,514 | B2 * | 11/2009 | Lee et al. | 365/210.1 |
| 2010/0296329 | A1 * | 11/2010 | Summerfelt et al. | 365/145 |

FOREIGN PATENT DOCUMENTS

| JP | 10-229171 A | 8/1998 |
|---|---|---|
| JP | 2001-358312 A | 12/2001 |

* cited by examiner

Primary Examiner — Son Mai
(74) Attorney, Agent, or Firm — Arent Fox LLP

(57) ABSTRACT

A semiconductor memory includes memory cells; word lines coupled to the memory cells; plate lines coupled to the memory cells; a selector that selects a first address signal in a first period and select a second address signal in a second period; a decode circuit that sequentially decodes the first and the second address signals selected by the selector, sequentially generates decode address signals based on the decoded first and second address signals, and sequentially activates the generated decode address signals; and a driver circuit that drives the word lines in accordance with the decode address signals activated based on the first address signal and drives the plate lines in accordance with the decode address signals activated based on the second address signal.

14 Claims, 15 Drawing Sheets

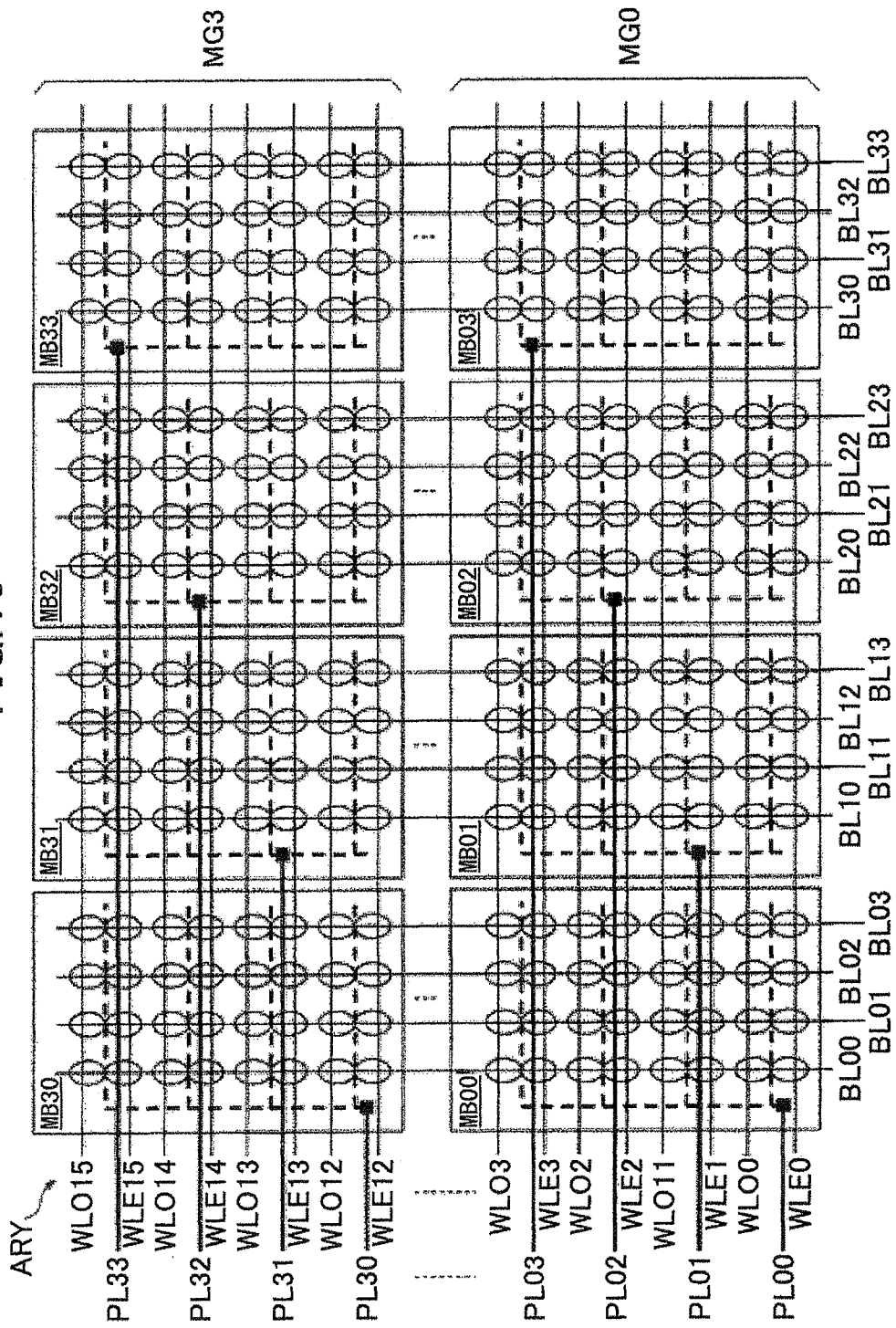

US 8,482,954 B2

SEMICONDUCTOR MEMORY AND METHOD FOR OPERATING THE SEMICONDUCTOR MEMORY

CROSS-REFERENCE TO RELATED APPLICATIONS

This application is a U.S. continuation application filed under 35 USC 111(a) claiming benefit under 35 USC 120 and 365(c) of PCT application JP 2009/000982, filed on Mar. 4, 2009. The foregoing applications are hereby incorporated herein by reference.

FIELD

The embodiment discussed herein is related to a semiconductor memory including word lines and plate lines wired in memory cells.

BACKGROUND

In a semiconductor memory such a ferroelectric memory, a plate line is commonly coupled to ferroelectric capacitors in plural memory cells, and the load capacity of the plate line is large. Because of those features, a waveform of a signal transmitted in the plate line may be rounded and a drive time using such a plate line may become longer. As a result, access time of the memory cell may be extended. To reduce the load capacity of the plate line, there is a known method of dividing the plate line into plural plate-line segments to reduce the number of memory cells coupled to each of the divided plural plate-line segments (see, for example, Japanese Laid-open Patent Publication No. 10-229171).

However, when the plate line is divided as such, the number of plate lines is accordingly increased. As a result, a scale of the logic circuit to select the plate lines may become larger, and accordingly the chip size of the semiconductor memory may become larger.

SUMMARY

According to an aspect, a semiconductor memory includes memory cells; word lines coupled to the memory cells; plate lines coupled to the memory cells; a selector that selects a first address signal in a first period and select a second address signal in a second period; a decode circuit that sequentially decodes the first and the second address signals selected by the selector, sequentially generates decode address signals based on the decoded first and second address signals, and sequentially activates the generated decode address signals; and a driver circuit that drives the word lines in accordance with the decode address signals activated based on the first address signal and drives the plate lines in accordance with the decode address signals activated based on the second address signal.

The object and advantages of the disclosure will be realized and attained by means of the elements and combinations particularly pointed out in the claims.

It is to be understood that both the foregoing general description and the following detailed description are exemplary and explanatory

BRIEF DESCRIPTION OF DRAWINGS

FIG. 15 is an example memory cell array illustrated in FIG. 13.

DESCRIPTION OF EMBODIMENT

In the following, embodiments are described with reference to the accompanying drawings. In the figures, a signal line illustrated by a bold line represents plural lines unless otherwise described. Further, a part of a block to which the bold line is coupled represents plural circuits. For a signal line transmitting a signal, the same symbol as the signal name is used. A signal having "Z" as a suffix indicates positive logic. A signal having "/" as a header indicates negative logic. A double-square symbol in the figures presents an external terminal. The external terminal includes a pad on a semiconductor chip, a lead wire of a package containing the semiconductor chip and the like. Regarding a signal supplied through the external terminal, the same symbol as the terminal name is used.

Figure 1:
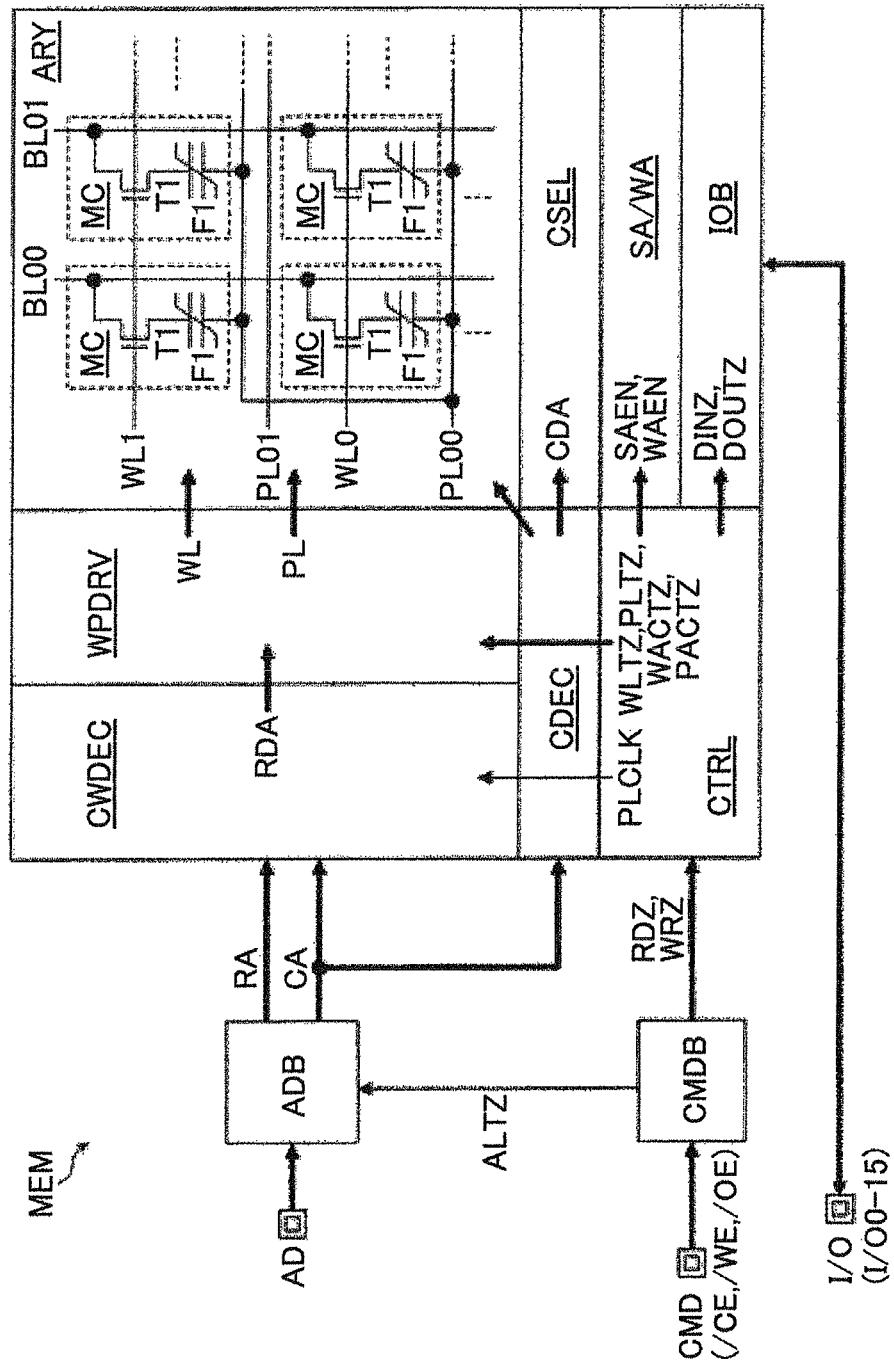
FIG. 1 is an example semiconductor memory according to an embodiment.

FIG. 1 illustrates a semiconductor memory MEM according to an embodiment. For example, the semiconductor memory MEM may be formed as a ferroelectric memory on a silicon substrate using a CMOS (Complementary Metal-Oxide Semiconductor) process. The ferroelectric memory may be used as, for example, a work memory for an IC card and a radio tag (i.e., RFID (Radio Frequency IDentification)), a work memory for a portable device such as a cellular phone and a digital camera, or a work memory for a consumer product such as a video recorder. The semiconductor memory MEM may operate in synchronization with a clock, or may operate asynchronously with a clock. The semiconductor memory MEM may be designed as a memory micro (IP) to be mounted in a system LSI (Large Scale Integration) or the like. Further, the semiconductor memory MEM may be designed as a semiconductor storage device sealed in a package.

The semiconductor memory MEM includes an address buffer ADB, a command buffer CMDB, a common word decoder CWDEC, a word plate driver WPDRV, a column decoder CDEC, an operation control circuit CTRL, a memory cell array ARY, a column selector CSEL, a sense amplifier SA, a write amplifier WA, and a data input/output circuit IOB.

The address buffer ADB receives an address signal AD via an address terminal, and outputs the received signal to the common word decoder CWDEC and the column decoder CDEC as a row address signal RA and a column address signal CA. The address buffer ADB latches the address signal AD. For example, the row address signal RA indicates upper bits of the address signal AD and is provided for selecting a word line WL. The column address signal CA indicates lower bits of the address signal AD and is provided for selecting a bit line BL. The row address signal RA and the column address signal CA are simultaneously supplied to different address terminals AD. Further, the address buffer ADB may predecode the address signal AD. In this case, the row address signal RA and the column address signal CA are the predecode signals.

The command buffer CMDB receives a command signal CMD to operate the memory cell array ARY, and decodes the received command signal CMD. For example, the command signal CMD includes a chip enable signal /CE, a write enable signal /WE, and an output enable signal /OE. The command buffer CMDB outputs a read control signal RDZ when the command signal CMD indicates a read command. The command buffer CMDB outputs a write control signal WRZ when the command signal CMD indicates a write command. The command buffer CMDB outputs an address latch signal ALT in response to the chip enable signal /CE. The address latch signal ALT may be generated by the operation control circuit CTRL. Further, when the semiconductor memory MEM has plural operation modes, the command buffer CMDB may decode the command signal CMD to change the operation mode and output the decoded command signal CMD to the operation control circuit CTRL as an operation mode change signal.

Figure 2:
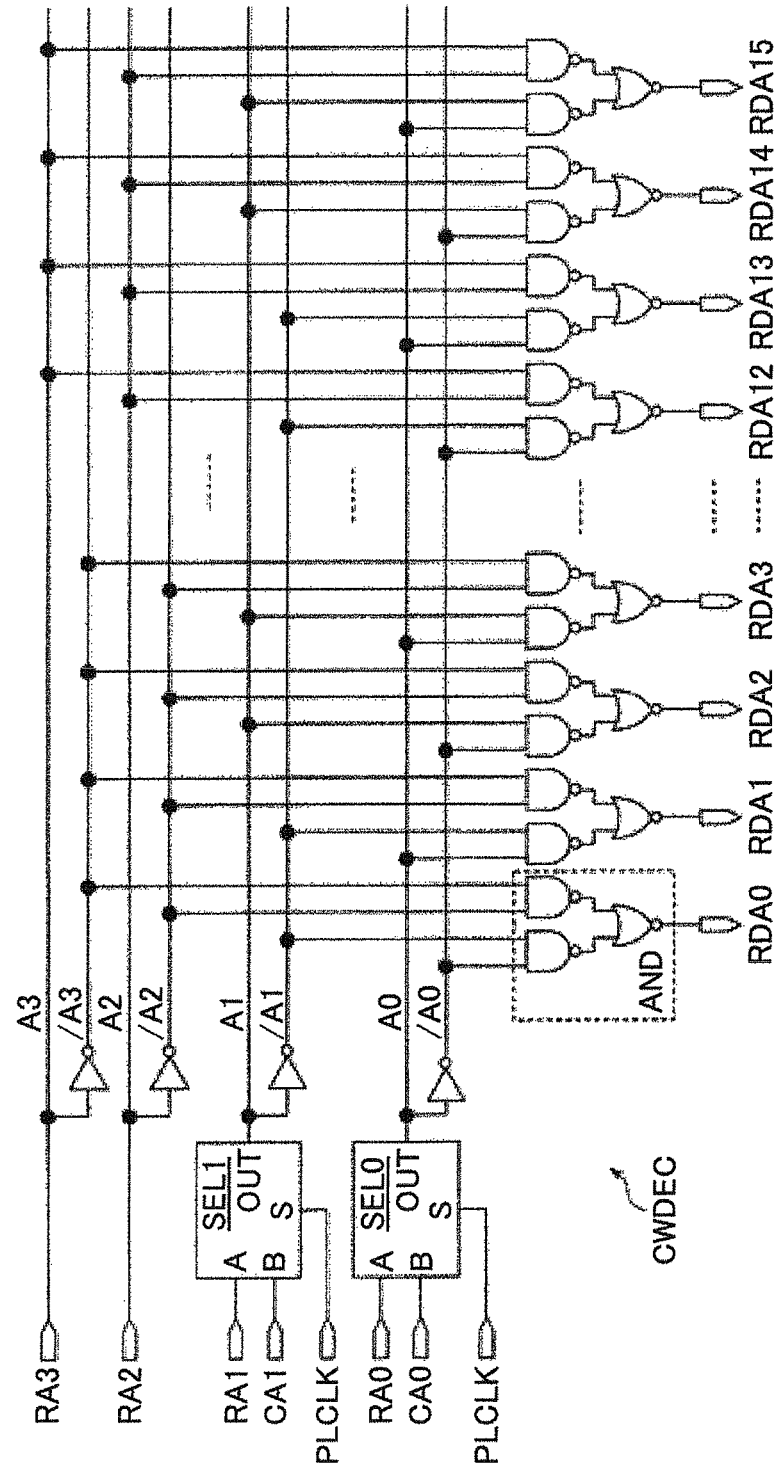
FIG. 2 is an example common word decoder illustrated in FIG. 1.

The common word decoder CWDEC receives the row address signal RA, the column address signal CA, and a plate selection signal PLCLK. The common word decoder CWDEC outputs a row decode address signal RDA to select the word line WL while the plate selection signal PLCLK is at a low level. The common word decoder CWDEC outputs the row decode address signal RDA to select the plate line PL while the plate selection signal PLCLK is at a high level. As described, the row decode address signal RDA is commonly used to select the word line WL and the plate line PL. By doing in this way, it may become possible to reduce the number of decode address signal lines to select the word line WL and the plate line PL and also reduce the area of the region where signal lines are wired. An example common word decoder CWDEC is illustrated in FIG. 2.

Figure 3:
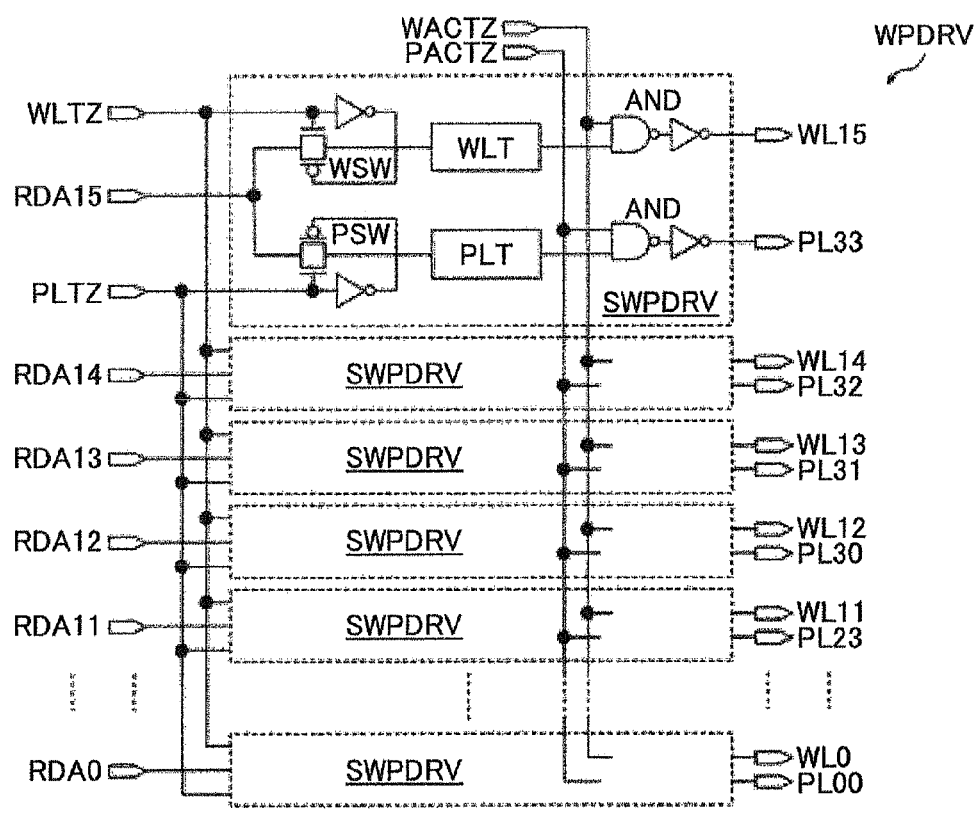
FIG. 3 is an example word plate driver illustrated in FIG. 1.

The word plate driver WPDRV receives the row decode address signal RDA, a word latch signal WLTZ, a plate latch signal PLTZ, a word activation signal WACTZ, and a plate activation signal PACTZ. The word plate driver WPDRV latches the row decode address signal RDA to select the word line WL in synchronization with the word latch signal WLTZ. The word plate driver WPDRV latches the row decode address signal RDA to select the plate line PL in synchronization with the plate latch signal PLTZ. The word plate driver WPDRV activates any of the word lines WL by setting a high level in synchronization with the word activation signal WACTZ while an effective row decode address signal RDA corresponding to the word line WL is latched. The word plate driver WPDRV activates any of the plate lines PL by setting a high level in synchronization with the plate activation signal PACTZ while an effective row decode address signal RDA corresponding to the plate line PL is latched. An example of the word plate driver WPDRV is illustrated in FIG. 3.

The column decoder CDEC decodes the column address signal CA and generates a column decode signal CDA in accordance with the decode result. The column decoder CDEC outputs the column decode signal CDA to the column selector CSEL.

The operation control circuit CTRL receives the read control signal RDZ or the write control signal WRZ, and sequentially generates and outputs plural control signals that operate the common word decoder CWDEC, the word plate driver WPDRV, the column decoder CDEC, the column selector CSEL, the sense amplifier SA, the write amplifier WA, and the data input/output circuit IOB and the like. For example, the control signals include the plate selection signal PLCLK, the word latch signal WLTZ, the plate latch signal PLTZ, the word activation signal WACTZ, the plate activation signal PACTZ, a sense amplifier enable signal SAEN, a write amplifier enable signal WAEN, a data input control signal DINZ, and a data output control signal DOUTZ. The control signals are timing signals that determine the operation timings of the common word decoder CWDEC, the word plate driver WPDRV, the column decoder CDEC, the column selector CSEL, the sense amplifier SA, the write amplifier WA, and the data input/output circuit IOB and the like.

Figure 4:
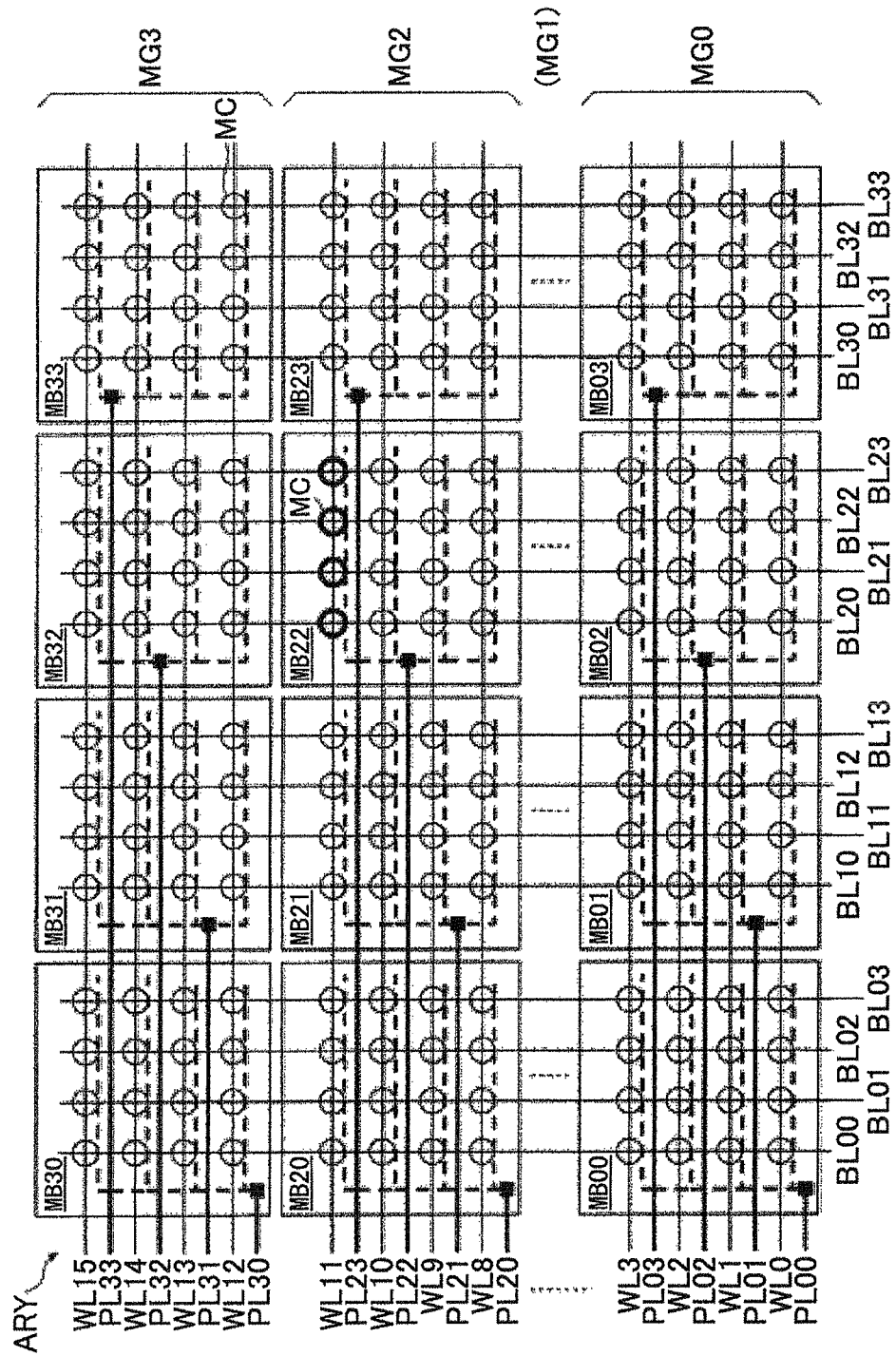
FIG. 4 is an example memory cell array illustrated in FIG. 1.

The memory cell array ARY includes plural ferroelectric memory cells MC arranged in a matrix manner. A line of the memory cells MC arranged in the lateral direction in the figure is coupled to a common word line WL (e.g., WL0, WL1, . . . ). A line of the memory cells MC arranged in the vertical direction in the figure is coupled to a common bit line BL (e.g., BL00, BL01, . . . ). A certain number of memory cells MC disposed in a rectangular region and arranged in the lateral and vertical directions are coupled to a common plate line (e.g., PL00, . . . ). The memory cell array ARY of FIG. 1 is a part of the memory block MB00 in FIG. 4. Coupling relationships between the memory cells MC and the plate lines PL are illustrated in FIG. 4.

The memory cell MC includes a selection transistor T1 (nMOS transistor) and the ferroelectric capacitor F1 which are arranged in series between the bit line BL and the plate line PL. Namely, the type of the memory cell MC is a so-called 1T1C type. The selection transistor T1 is turned ON when the gate receives a high-level word line signal WL. The ferroelectric capacitor F1 operates as a variable-capacitance capacitor based on the feature that a residual polarization remains even when the applied voltage is zero. The residual polarization value of the ferroelectric capacitor F1 is changed by a write operation of the memory cell MC. The memory cell MC stores the logical value of data based on the residual polarization value. Namely, the semiconductor memory MEM operates as a rewritable non-volatile memory.

The type of the memory cell MC may be so-called a 2T2C type. The 2T2C-type memory cell MC includes a pair of selection transistors (nMOS transistor) and a pair of ferroelectric capacitors. The gates of the pair of the selection transistors are coupled to a common word line WL. The pair of the ferroelectric capacitors store data having different (inverted) logics (logic values) and are coupled to the bit lines which are compliment to each other.

The column selector CSEL includes plural column switches connecting the bit lines to the sense amplifier SA and the write amplifier WA. The column switch corresponding to an effective column decode signal CDA is turned ON in synchronization with a control signal output from the operation control circuit CTRL in read operation and in write operation.

The sense amplifier SA operates in synchronization with the sense amplifier enable signal SAEN in read operation.

The sense amplifier SA amplifies a difference between a voltage and a reference voltage VREF (see FIG. 9), the voltage being read on the bit line BL selected by the column switch in read operation. Then, the sense amplifier SA reads the amplified signal and output the read signal to the data input/output circuit IOB as read data. The sense amplifier SA is shared by plural bit lines BL via the column selector CSEL. By having this configuration, it may become possible to reduce the number of sense amplifiers SA. The sense amplifier SA may be disposed between the column selector CSEL and the memory cell array ARY. In this case, one sense amplifier is disposed for each of the bit lines BL.

The write amplifier WA operates in synchronization with the write amplifier enable signal WAEN in write operation. The write amplifier WA outputs write data to the bit line BL selected by the column switch, the write data being supplied via the data input/output circuit IOB in write operation.

The data input/output circuit IOB receives the write data supplied to a data input/output terminal I/O in synchronization with the data input control signal DINZ, and outputs the received data to the write amplifier WA. Further, the data input/output circuit IOB receives the read data from the memory cell MC via the sense amplifier SA, and outputs the data to the data input/output terminal I/O in synchronization with the data output control signal DOUTZ. For example, the data input/output terminal has 16-bit I/O (I/O0-I/O15).

FIG. 2 illustrates the example common word decoder CWDEC in FIG. 1. Herein, to simplify the description, a case is described where the row address signal RA has four bits (RA0-3) and the column address signal CA has two bits (CA0-1). The common word decoder CWDEC generates sixteen row decode address signal RDA (RDA0-15). In an actual semiconductor memory MEM, for example, the row address signal RA has eight bits and the column address signal CA has six bits. In this case, the common word decoder CWDEC generates 256 row decode address signal RDA (RDA0-255).

The common word decoder CWDEC includes selectors SEL (SEL0-1) and plural AND circuits. When the plate selection signal PLCLK is at a low level, the selector SEL0 outputs the row address signal RA0 as the address signal A0. When the plate selection signal PLCLK is at a high level, the selector SEL0 outputs the column address signal CA0 as the address signal A0. In the same manner, when the plate selection signal PLCLK is at a low level, the selector SEL1 outputs the row address signal RA1 as the address signal A1. When the plate selection signal PLCLK is at a high level, the selector SEL1 outputs the column address signal CA1 as the address signal A1.

The number of selectors SEL is determined based on the division number (in the lateral direction in FIG. 4) of the columns in the memory cell array ARY. In this embodiment, as illustrated in FIG. 4, the division number of the columns is equivalent to the number of the memory blocks MB coupled to one word line WL. The division number of the columns is equivalent to the number of the word lines WL coupled to one memory block MB. The memory blocks MB are coupled to different plate lines PL. In FIG. 4, the division number of the columns and the number of word lines WL coupled to one memory block MB are 4.

For example, when the division number of the columns is 8, in addition to the configuration in FIG. 2, a selector SEL2 receiving the row decode address signal RA2 and the column address signal CA2 is disposed. In this case, the number of word lines WL coupled to one memory block MB is 8. When the division number of the columns is 2, one selector SEL receiving the row decode address signal RA0 and the column address signal CA0 is disposed. In this case, the number of word lines WL coupled to one memory block MB is 2.

The AND circuit decodes four-bit address signal A0 (or /A0), A1 (or /A1), A2 (or /A2), and A3 (or /A3). When all the received signals are at a high level, the AND circuit sets the row decode address signal RDA (any of RDA0-15) to a high level. The plural AND circuits operate as a decode circuit that decodes the four-bit address signal A0-A3 (or /A0-/A3) and that activates any of the row decode address signal RDA (RDA0-15).

When the plate selection signal PLCLK is at a low level, in accordance with the row address signal RA0-3, the common word decoder CWDEC sets any of the row decode address signal RDA0-15 at a high level and maintains the rest of the row decode address signal RDA at a low level. In this case, as described with reference to FIG. 3, any of the word lines WL is selected. When the plate selection signal PLCLK is at a high level, in accordance with the column address signal CA0-1 and the row address signal RA2-3, the common word decoder CWDEC sets any of the row decode address signal RDA0-15 at a high level and maintains the rest of the row decode address signal RDA at a low level. In this case, as described with reference to FIG. 3, any of the plate lines PL is selected.

As described above, in accordance with selectors SEL0-1, the AND circuit operates as an address decode circuit that generates the row decode address signal RDA0-15 to select the word lines WL and an address decode circuit that generates the row decode address signal RDA0-15 to select the plate lines WL. In this embodiment, a word decoder to select the word line WL and a plate decoder to select the plate line PL may be replaced by the common word decoder CWDEC. Because of this feature, it may become possible to reduce the circuit scale of the plate decoder (in this example, common word decoder CWDEC). For example, when the division number of the plate line PL is large, the circuit scale of the plate decoder may be reduced. For example, when plural plate lines PL are wired to correspond to one word line WL, the circuit scale of the plate decoder may be reduced.

The common word decoder CWDEC directly decodes the row address signal RA0-3 and the column address signal CA0-1 supplied to the external address terminals AD, and generates the row decode address signal RDA. In other words, the row decode address signal RDA is generated without using any signal beyond the decode circuit (AND circuit). Because of this feature, it may become possible to reduce the number of stages of certain circuits (transistors) to generate the row decode address signal RDA. Therefore, the row decode address signal RDA may be generated quickly and the access time of the semiconductor memory MEM (read operation time and write operation time) may be reduced.

In a stand-by period when read operation or write operation is not executed, the AND circuit receives low-level address signal A0-A3, /A0-/A3, and maintains all the row decode address signal RDA0-15 at a low level. In order to set the address signal A0-A3, /A0-/A3 at a low level, the address signal A0-A3, /A0-/A3 are supplied to the AND circuit via an enable circuit. For example, the enable circuit may be an AND circuit that receives any of the address signal A0-A3, /A0-/A3 and an enable signal. The enable signal is set to a high level in access operation (in read operation or in write operation), and is set to a low level in the stand-by period. In the stand-by period, by outputting a low level from all the enable circuits to the AND circuit, all the row decode address signal RDA0-15 are maintained at a low level.

FIG. 3 illustrates an example of the word plate driver WPDRV illustrated in FIG. 1. The word plate driver WPDRV is a driver circuit and includes plural sub word plate drivers SWPDRV that drive a pair of the word line WL and the plate line PL. The sub word plate drivers SWPDRV have the same circuits. Therefore, the sub word plate driver SWPDRV that drives the word line WL15 and the plate line PL33 is described.

The sub word plate driver SWPDRV includes switch circuits WSW, PSW, latch circuits WLT, PLT, and two AND circuits. While the word latch signal WLTZ is at a high level, the switch circuit WSW supplies the row decode address signal RDA15 to the latch circuit WLT. While the plate latch signal PLTZ is at a high level, the switch circuit WSW supplies the row decode address signal RDA15 to the latch circuit PLT. To maintain the logic level of the row decode address signal RDA15, the latch circuits WLT, PLT include, for example, a pair of inverters connecting the input and the output. When a high level is maintained in the latch circuit WLT, the AND circuit coupled to the word line WL15 drives the word line WL15 in synchronization with the word activation signal WACTZ, and activates the word line WL15 at a high level. When a high level is maintained in the latch circuit PLT, the AND circuit coupled to the plate line PL33 drives the plate line PL33 in synchronization with the plate activation signal PACTZ, and activates the plate line PL33 at a high level.

In read operation and in write operation, the word plate driver WPDRV sequentially receives a high level of any of the row decode address signal RDA0-15 to select the word line WL and a high level of row decode address signal RDA0-15 to select the plate line PL. Any one of the latch circuits WLT latches the high-level row decode address signal RDA and outputs a high level. Other latch circuits WLT output a low level. Any one of the latch circuits PLT latches the high-level row decode address signal RDA and outputs a high level. Other latch circuits PLT output a low level. Then, the word plate driver WPDRV sequentially drives any of the word lines WL0-15 and any of the plate lines PL00-03, PL10-13, PL20-23, and PL30-33 at a high level.

In this embodiment, the row decode address signal RDA0-15 sequentially supplied to the word plate driver WPDRV are selectively latched by any of the latch circuits WLT and PLT using the switch circuits WSW, PSW. By doing this, in accordance with the row decode address signal RDA0-15 for the word lines WL and the row decode address signal RDA0-15 for the plate line PL transmitted by the common signal lines RDA0-15, the word line WL and the plate line PL are activated.

Figure 9:
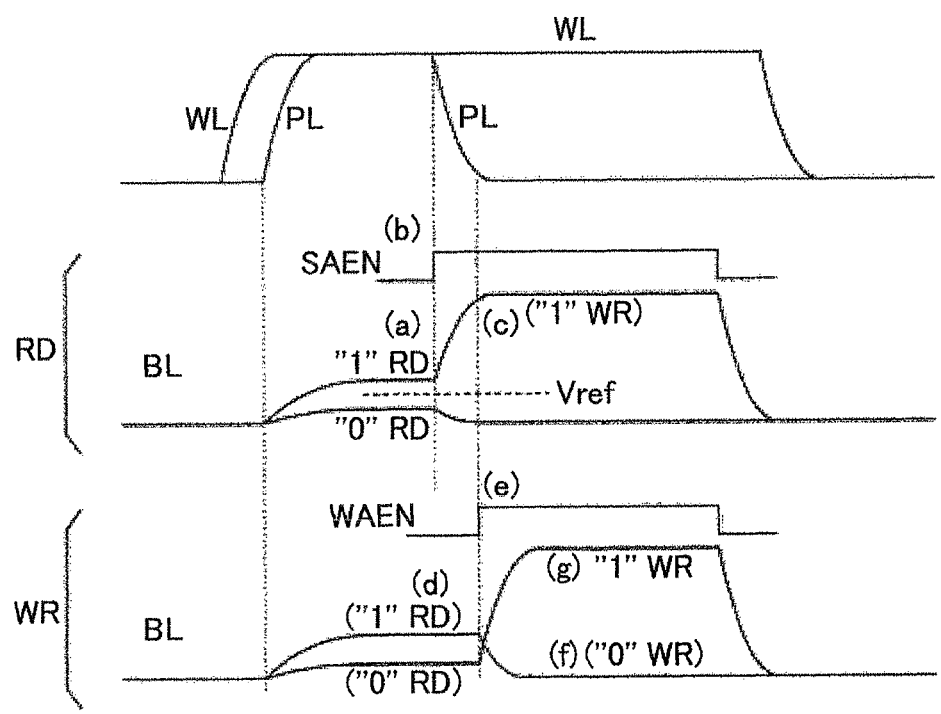
FIG. 9 is an example operation of the memory cell array of the semiconductor memory illustrated in FIG. 1.

The logic level of the row decode address signal RDA0-15 latched by the latch circuit WLT is output as the word line signal WL in synchronization with the word activation signal WACTZ. The logic level of the row decode address signal RDA0-15 latched by the latch circuit PLT is output as the plate line signal PL in synchronization with the plate activation signal PACTZ. Therefore, even when the row decode address signal RDA0-15 for the word lines WL and the row decode address signal RDA0-15 for the plate lines PL are supplied in a time division manner, the word line and the plate line may be activated at desired timings. In other words, as illustrated in FIG. 9, the word line WL and the plate line PL may be redundantly (overlappedly) activated.

FIG. 4 illustrates an example of the memory cell array ARY illustrated in FIG. 1. For example, the memory cell array ARY includes sixteen memory blocks MB (MB00-03, MB10-13, MB20-23, MB30-33) arranged in a matrix manner. Four memory blocks MB arranged in the lateral direction in the figure constitute each of the memory groups MG (MG0-3). The number affixed to the memory groups MG is indicated by the row address signal RA3-2. The memory blocks MB are coupled to different plate lines PL (PL00-03, PL10-13, PL20-23, PL30-33). Namely, the number of the memory blocks MB is equal to the number of plate lines PL. The upper bits of the two-digit number affixed to the memory blocks MB and the plate lines PL are the same value of the number affixed to the memory group MG, and are indicated by the row address signal RA3-2. The lower bit of the row address signal RA3-2 are indicated by the column address signal CA1-0.

Each of the memory blocks MB is coupled to four word lines. Four memory blocks in each of the memory groups MG are coupled to common four word lines WL. The word lines WL and the plate lines PL indicated by bold solid lines are alternately wired. Namely, four plate lines (e.g., PL00-03) are wired on the four memory blocks MB in each of the memory groups MG. Each of the plate lines PL is divided in the memory block having the same number into plate lines indicated by bold dotted lines to be coupled to the memory cells MC. Namely, one of the four plate lines (e.g., PL00-03) is coupled to each of the memory blocks MB. Black rectangular symbols in the figure denote contacts to divide plate line PL.

The word line WL and the plate line PL are selected using common row address signal RA2-3. Because of this feature, simply by increasing the AND circuits, plural memory groups MG may be formed and the division number of the plate lines PL may be increased. Namely, each of the divided multiple plate lines PL may be selected using a simple decode circuit. As a result, in a semiconductor memory MEM having a large division number of the plate lines PL, a scale of the logic circuit to select the plate line may be reduced, and accordingly the chip size of the semiconductor memory MEM may also be reduced.

Each of the memory blocks MB is coupled four bit lines BL0-3 (BL00-03, BL10-13, BL20-23, BL30-33). Four memory blocks MB arranged in the vertical direction in the figure are coupled to common four bit lines BL0-3 (e.g., BL00-03). The upper bits of the two-digit number affixed to the bit lines BL are indicated by the column address signal CA. The lower bits of the two-digit number indicate the number of a data terminal I/O. In read operation or in write operation, the column selector CSEL indicated in FIG. 1 couples any of the four bit line groups BL00-03, BL10-13, BL20-23, BL30-33 to the sense amplifier SA or the write amplifier WA in accordance with the lower bit value of the column address signal CA.

Herein, to simplify the description, a case is described where each of the bit line groups has four bit lines. Actually, each of the bit line groups includes sixteen bit lines BL corresponding to the data terminals I/O0-15. When the data terminal I/O is one bit (I/O0), each of the bit line groups has one bit line.

Each of the memory blocks MB includes sixteen memory cells MC arrange in a matrix manner. For example, in read operation or in write operation, it is assumed that the row address signal RA3-0 indicating "1011" in binary and the column address signal CA1-0 indicating "10" in binary are supplied. In this case, the word line WL11 indicated by the row address signal RA3-0 and the plate line PL22 indicated by the row address signal RA3-2 and the column address signal CA1-0 are selected. Then, data are read from the memory cells MC indicated by bold circles in the memory block MB22 to the bit lines BL20-23. Otherwise data are written into the memory cells MC indicated by bold circles in the memory block MB22 via the bit lines BL20-23.

When the common word decoder CWDEC illustrated in FIG. 2 includes three selectors SEL0-2, as described above, eight memory blocks MB are formed along the word lines WL (in the lateral direction in the figure). Namely, eight memory groups MG are formed. Eight memory blocks MB of each of the memory groups MG are coupled to common eight word lines WL. The selectors SEL0-2 receive the row address signal RA0-2 or the column address signal CA0-2 in accordance with the plate selection signal PLCLK. In read operation or in write operation, any of eight memory blocks MB in the memory group MG is selected in accordance with the column address signal CA0-2. On the eight memory blocks MB in the memory group MG, eight plate lines PL are wired and coupled to any of eight memory blocks MB. When the row address signal RA has eight bits (RA0-7), the memory cell array ARY includes 256 word lines WL. In this case, eight word lines WL are coupled to each of the memory blocks MB. Therefore, eight memory blocks MB are arranged in the vertical direction of the figure. Namely, the number of the memory groups is eight. A total number of the memory blocks MB is 256 (8 in lateral by 8 in vertical) and is equal to the number of the plate lines PL and the number of word lines WL.

As described above, when the number of the selectors is m, the memory blocks MB of the number of m-th power of 2 (2.sup.m) are arranged along the word lines WL (in the lateral direction of the figure). The plate line PL is wired to each of the memory blocks MB. Each of the memory groups MG and each of the memory blocks MB are coupled to the word lines WL of the number of m-th power of 2 (2.sup.m). When the number of bits of the row address signal RA is n, the number of the word lines WL, the number of the plate lines PL, and the number of memory blocks MB are commonly equal to the number of n-th power of 2 (2.sup.n). The number of the memory groups MG is equal to the number of (n−m)-th power of 2 (2.sup.(n−m)).

Figure 5:
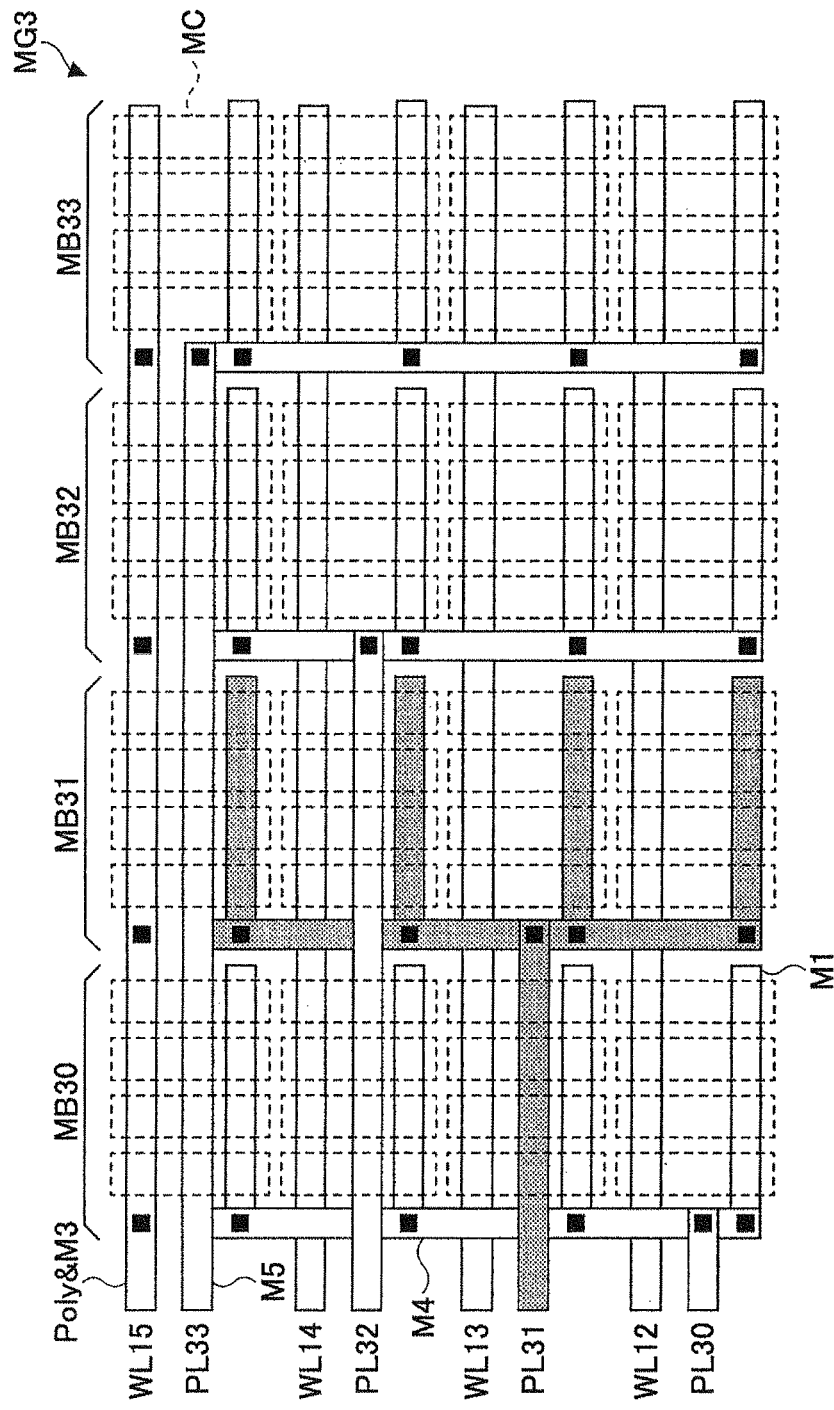
FIG. 5 is an example wiring layout of the memory cell array illustrated in FIG. 4.

FIG. 5 illustrates an example wiring layout of the memory cell array ARY illustrated in FIG. 4. In FIG. 5, the memory group MG3 (memory blocks MB30-33) in FIG. 4 is illustrated. Further, to make the wiring of the plate line PL more evident, the plate line PL31 is indicated by using shaded areas. A polysilicon layer Poly is a wiring layer to form the gates of transistors. First, second, third, fourth, and fifth metal wiring layers are formed on the polysilicon layer Poly, and the larger the number is, the more it is separated from the semiconductor substrate.

The word lines WL are wired using the polysilicon layer Poly and the third metal wiring layer M3. As described above, the polysilicon layer Poly is a wiring layer to form the gates of transistors. The word lines WL formed in the polysilicon wiring Poly are coupled via contacts indicated by black rectangular symbols to the word lines formed in the third metal wiring layer M3. The plate lines PL are wired using the first, the fourth, and the fifth metal wiring layers M1, M4, and M5. The plate lines PL formed in the fifth metal wiring layer M5 are wired in the lateral direction in the figure, and are coupled via contacts to the plate lines PL formed in the fourth metal wiring layer M4. The plate lines PL formed in the forth metal wiring layer M4 are coupled via contacts to the plate lines PL formed in the first metal wiring layer M1.

Each of the memory cells MC is coupled to the word line formed in the polysilicon wiring Poly and the plate line PL formed in the first metal wiring layer M1. The memory cells MC may be manufactured using (for example, but not limited to) a stack-type manufacturing process. The bit lines BL (not shown) are formed in the vertical direction of the figure using the second metal wiring layer M2.

Figure 6:
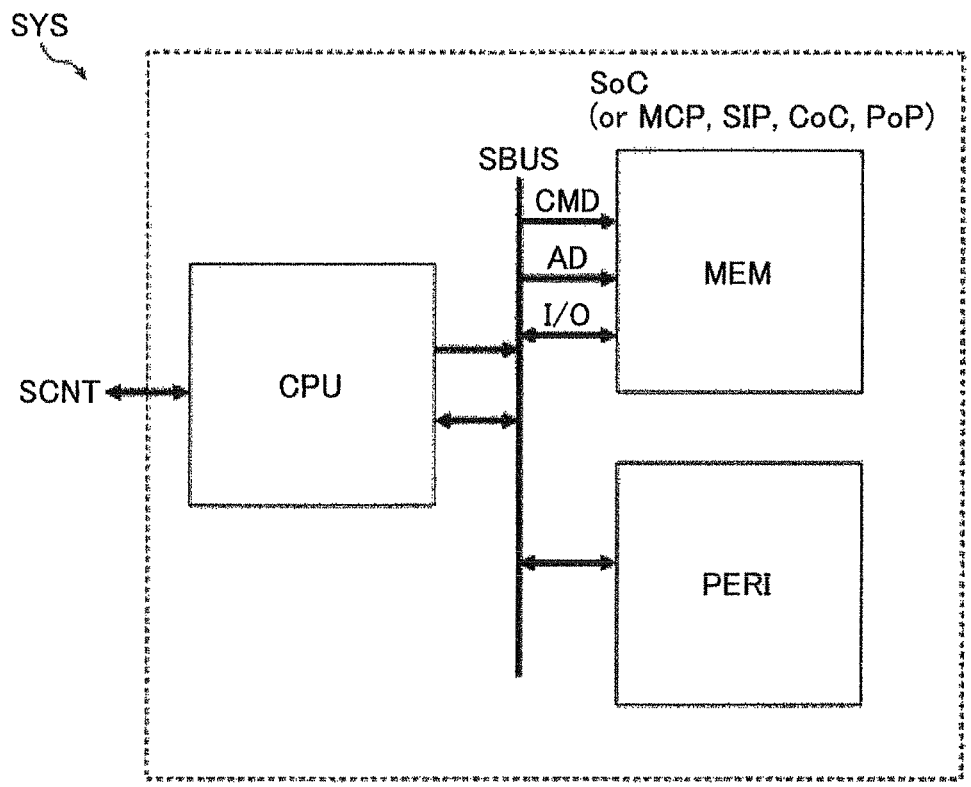
FIG. 6 is an example system in which the semiconductor memory illustrated in FIG. 1 is mounted.

FIG. 6 illustrates an example system SYS in which the semiconductor memory MEM of FIG. 1 is mounted. The system SYS (user system) may constitute at least a part of a microcomputer system such as a mobile device. In an embodiment described below as well, the semiconductor memory MEM is mounted in a system SYS similar to that of FIG. 6. The system SYS may include a system on chip SoC where plural macros are integrated on a silicon substrate. Otherwise, for example, the system SYS may include a multi-chip package MCP where plural chips are mounted on a package substrate. Otherwise, for example, the system SYS may include a system ion package SiP where plural chips are mounted on a package substrate such as a lead frame. Further, the system SYS may be formed in a chip-on-chip CoC or a package-on-package manner.

For example, the SoC includes a CPU (controller), the semiconductor memory MEM illustrated in FIG. 1 and a peripheral circuit PERI. The CPU, the semiconductor memory MEM, and the peripheral circuit PERI are coupled to each other via a system bus SBUS. The CPU accesses the semiconductor memory MEM and the peripheral circuit PERI, and controls operations of the total system. The semiconductor memory MEM performs the read operation and the write operation in accordance with an access command CMD (access request) from the CPU and the address signal AD. For example, the SoC is coupled to an upper system via an external bus SCNT. The minimum configuration of the system SYS includes the CPU and the semiconductor memory MEM.

Figure 7:
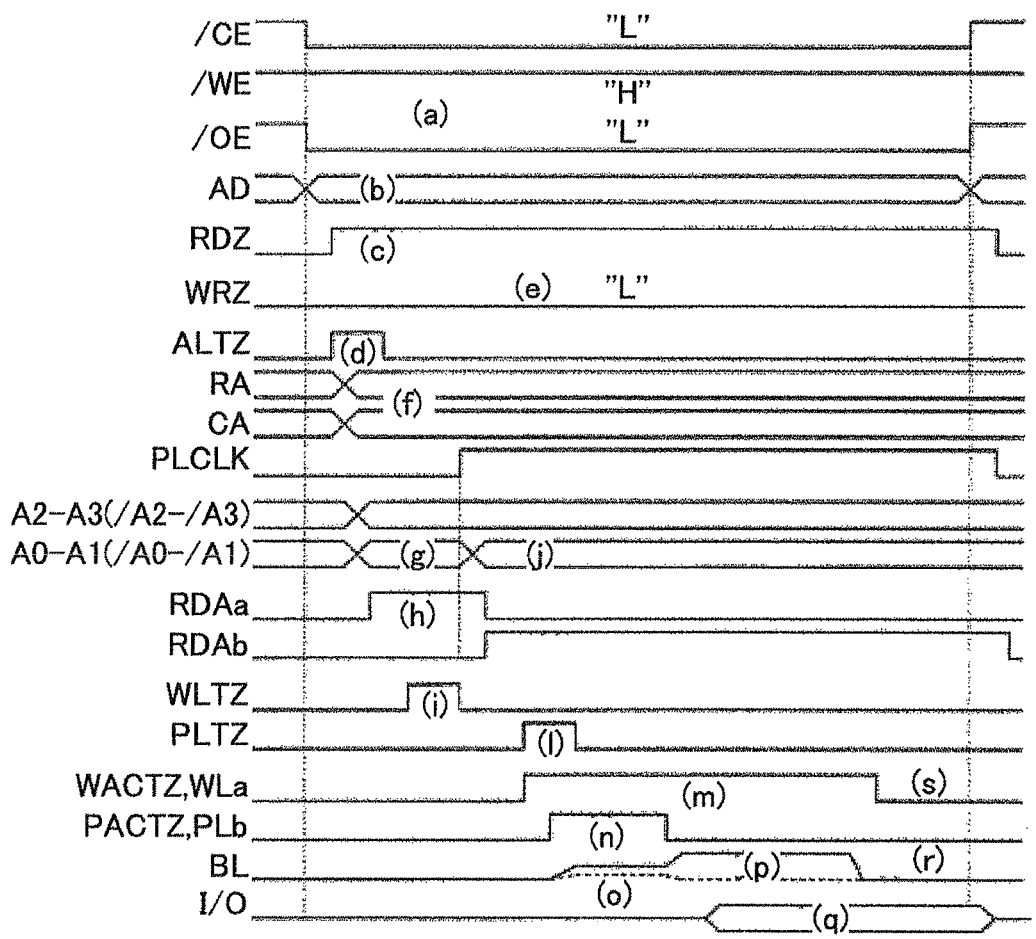
FIG. 7 is an example read operation of the semiconductor memory illustrated in FIG. 1.

FIG. 7 illustrates an example read operation of the semiconductor memory MEM illustrated in FIG. 1. The semiconductor memory MEM performs the read operation upon receiving a read command (a low level L of the chip enable signal /CE, a high level H of the write enable signal /WE, and a low level L of the output enable signal /OE) ((a) of FIG. 7). The CPU illustrated in FIG. 6 outputs the address signal AD along with the read command to the semiconductor memory MEM ((b) of FIG. 7). In response to the read command, the command buffer CMDB illustrated in FIG. 1 activates the read control signal RDZ and the address latch signal ALTZ at a high level ((c),(d) of FIG. 7). The write control signal WRZ is maintained at a low level L ((e) of FIG. 7).

The address buffer ADB latches the address signal AD in synchronization with the address latch signal ALTZ, and outputs the latched address signal AD as the row address signal RA and the column address signal CA ((f) of FIG. 7). The selectors SEL0-1 of the common word decoder CWDEC illustrated in FIG. 2 output the row address signal RA0-1 as the address signal A0-1, /A0-1 while the plate selection signal PLCL is a low level ((g) of FIG. 7). The common word decoder CWDEC sets the row decode address signal RDA (e.g., RDAa, a: any of 0-15) to select the word lines WL at a high level in accordance with the row address signal RA0-3 ((h) of FIG. 7). Other row decode address signals RDA are maintained at a low level. The word plate driver WPDRV latches the row decode address signal RDAa in synchronization with the word latch signal WLTZ ((i) of FIG. 7).

Next, the selectors SEL0-1 of the common word decoder CWDEC receive a high-level plate selection signal PLCLK and output the column address signal CA0-1 as the address signal A0-1, /A0-1 ((j) of FIG. 7). After a certain time period (e.g., 10 ns) has passed since the receipt of the read command or the write command, the operation control circuit CTRL changes the level of the plate selection signal PLCLK from a low level to a high level. The common word decoder CWDEC sets the row decode address signal RDA (e.g., RDAb, b: any of 0-15) to select the plate lines PL to a high level in accordance with the column address signal CA0-1 and the row address signal RA2-3 ((k) of FIG. 7). Other row decode address signals RDA are maintained at a low level. The word plate driver WPDRV latches the row decode address signal RDAb in synchronization with the plate latch signal PLTZ ((1) of FIG. 7).

The word plate driver WPDRV activates the word line WLa corresponding to the row decode address signal RDAa at a high level in synchronization with the word activation signal WACTZ ((m) of FIG. 7). Other word lines WL are maintained at a low level. By the activation of the word line WLa, the ferroelectric capacitor F1 of the memory cell MC is coupled to the bit line BL. Next, the word plate driver WPDRV activates the plate line PLb corresponding to the row decode address signal RDAb to a high level in synchronization with the plate activation signal PACTZ ((n) of FIG. 7). Other plate lines PL are maintained at a low level. An activation period of the plate line PLb is included in an activation period of the word line WLa.

In synchronization with the activation of the plate line PLb, a charge (voltage) corresponding to the residual polarization of the ferroelectric capacitor F1 is read to the bit line BL ((o) of FIG. 7). The solid line indicates a waveform when logic 1 is read from the memory cell MC to the bit line BL. The dotted line indicates a waveform when logic 0 is read from the memory cell MC to the bit line BL. Upon reading data from the memory cell MC to the bit line BL, for example, a reference charge (voltage) is read from a reference cell. The column selector CSEL couples the bit line BL corresponding to the column address signal CA to the sense amplifier SA. The sense amplifier SA differentially amplifies a difference between the voltage of the bit line BL and the reference voltage, and determines the logic of the data stored in the memory cell MC ((p) of FIG. 7). The data input/output circuit IOB outputs the read data amplified by the sense amplifier SA to the data terminal I/O ((q) of FIG. 7). After that, the sense amplifier SA is deactivated so that the bit line BL is set to a low level ((r) of FIG. 7). Next, the word activation signal WACTZ and the word line WLa are deactivated to a low level to terminate the read operation ((s) of FIG. 7).

Figure 8:
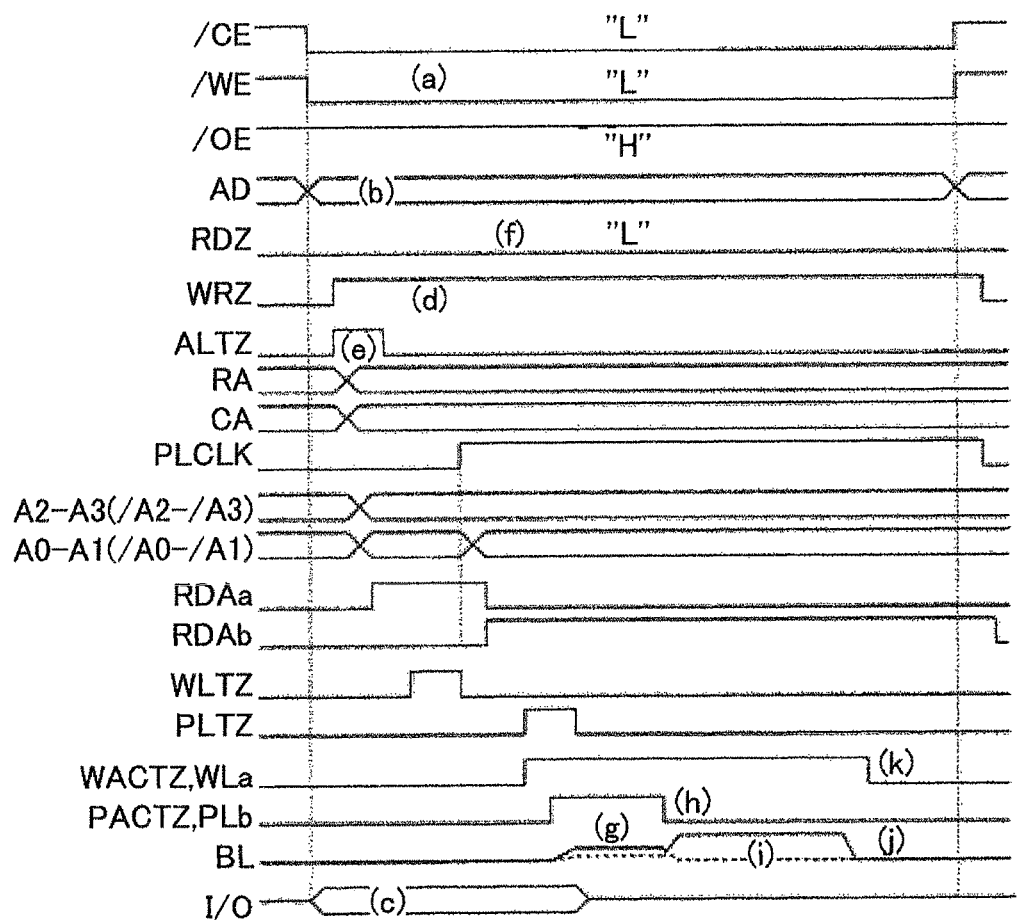
FIG. 8 is an example write operation of the semiconductor memory illustrated in FIG. 1.

FIG. 8 illustrates an example write operation of the semiconductor memory MEM of FIG. 1. Detailed descriptions similar to the operation described with reference to FIG. 7 are herein omitted. The semiconductor memory MEM performs the write operation upon receiving a write command (a low level L of the chip enable signal /CE, a low level L of the write enable signal /WE, and a high level H of the output enable signal /OE) ((a) of FIG. 8). The CPU illustrated in FIG. 6 outputs the address signal AD and a data signal I/O (write data) along with the write command to the semiconductor memory MEM ((b), (c) of FIG. 8). In response to the write command, the command buffer CMDB activates the write control signal WRZ and the address latch signal ALTZ to a high level ((d),(e) of FIG. 8). The read control signal RDZ is maintained at a low level L ((f) of FIG. 8).

The waveforms from the address latch signal ALTZ to the plate activation signal PACTZ are the same as those in FIG. 7. In synchronization with the activation of the plate line PLb, a charge (voltage) corresponding to the residual polarization of the ferroelectric capacitor F1 is read to the bit line BL ((g) of FIG. 8). In this case, as described below with reference to FIG. 9, the data of memory cells MC having logic 1 are deleted and replaced by logic 0. The column selector CSEL couples the bit line BL corresponding to the column address signal CA to the write amplifier WA. The write amplifier WA outputs the level corresponding to logic of the write data to the bit line BL. Before the voltage of the bit line BL changes due to the write data from the write amplifier WA, the plate line PL is deactivated to a low level ((h) of FIG. 8). Then, in accordance with the low level of the plate line PL and the voltage level of the bit line BL, either logic 1 or logic 0 is written in the memory cell MC ((i) of FIG. 8). After that, the bit line BL is set to a low level by the write amplifier WA ((j) of FIG. 8). Next, the word activation signal WACTZ and the word line WLa are deactivated to a low level to terminate the write operation ((k) of FIG. 8).

FIG. 9 illustrates an example operation of the memory cell array ARY of the semiconductor memory MEM of FIG. 1. FIG. 9 illustrates a period when the word line and the plate line PL are activated at a high level in FIGS. 7 and 8.

In read operation RD, the voltage increase in the bit line BL when the plate line PL is driven to a high level is small. Because of this feature, regardless of the logic of data read from the memory cell MC, the level of the bit line BL is lower than the high level of the plate line PL ((a) of FIG. 9). This state indicates the write of logic 0 to the memory cell MC. Namely, when logic 1 is read from the memory cell MC to the bit line BL, the residual polarization value of the ferroelectric capacitor F1 is inverted and the data stored in the memory cell is replaced by logic 0.

For example, the sense amplifier SA is activated by the sense amplifier enable signal SAEN before the level of the plate line PL is changed to a low level ((b) of FIG. 9). When logic 1 is read to the bit line BL, the sense amplifier SA differential amplifies a difference between the voltage of the bit line BL (e.g., power voltage) and the reference voltage Vref, and increases the voltage of the bit line BL to a high level ((c) of FIG. 9). Then, by making the level of the bit line BL higher than the low level of the plate line PL, logic 1 is written to the memory cell MC again.

In write operation WR, similar to the read operation RD, writing logic 0 to the memory cell MC occurs while the level of the plate line PL is high ((d) of FIG. 9). Namely, the data of the memory cell MC having logic 1 is changed to logic 0. For example, the write amplifier WA is activated by the write amplifier enable signal WAEN after the level of the plate line PL is changed to a low level ((e) of FIG. 9). When the write data is logic 0, both the plate line PL and the bit line BL are set to have a low level, and the residual polarization value of the ferroelectric capacitor F1 does not changes. Namely, the memory cell MC maintains logic 0 obtained (changed) by the activation of the plate line PL ((f) of FIG. 9). When the write data is logic 1, the plate line PL is set to have a low level and the bit line BL is set to have a high level (e.g., power voltage). In this case, the logic of the memory cell MC is changed to have logic 1 ((g) of FIG. 9). Then, the write operation of writing logic 0 and logic 1 to the memory cells MC terminates.

In read operation RD and in write operation WR, it may be necessary to surely transmit the high level (power voltage) of the bit line BL to the ferroelectric capacitor F1. To that end, in a period where the sense amplifier SA or the write amplifier WA operates, the voltage of the high level of the word line WL may be set higher than the power voltage. In this case, it is preferable that the voltage of the high level be equal to or greater than a value obtained by adding the threshold value voltage of the selection transistor T1 to the power voltage.

As described above, in this embodiment, the word decoder to select the word line WL and the plate recorder to select the plate line PL may be replaced by the common word decoder CWDEC. Because of this feature, the circuit scale of the plate decoder (in this embodiment, common word decoder CWDEC) may be reduced. For example, when the division number of the plate line PL is large, the circuit scale of the plate decoder may be reduced. For example, when plural plate lines PL are wired to correspond to one word line WL, the circuit scale of the plate decoder may be reduced. Further, the row decode address signal RDA are commonly used to select the word line WL and the plate line PL. By doing this, the number of the row decode address signal RDA to select the word line WL and the plate line PL may be reduced and the size of the wiring region of the signal lines may be reduced. As a result, the chip size of the semiconductor memory MEM may be reduced.

Figure 10:
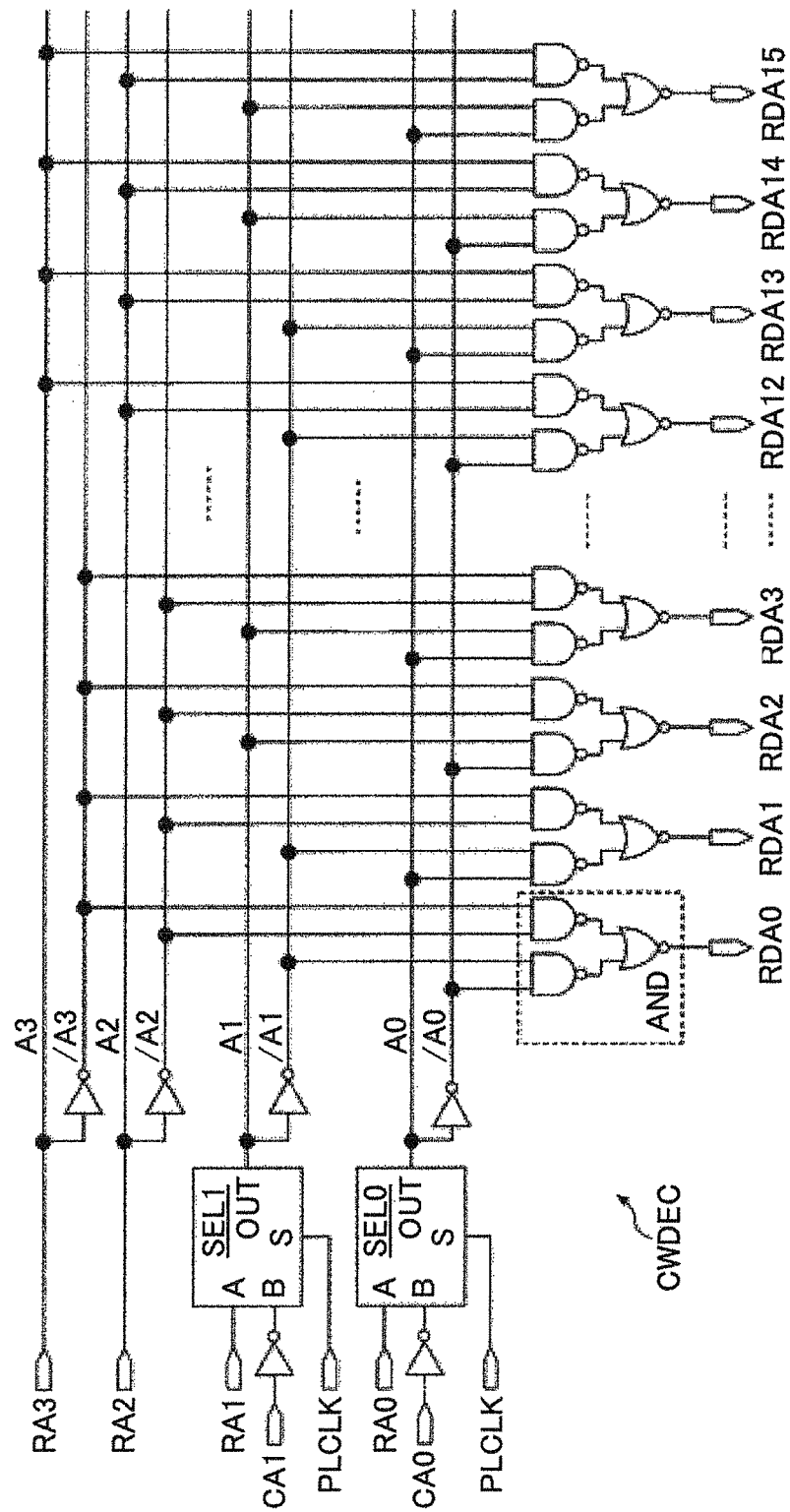
FIG. 10 is an example common word decoder in a semiconductor memory according to another embodiment.

FIG. 10 illustrates an example common word decoder CWDEC in a semiconductor memory MEM according to another embodiment. Herein, the same signs are used for the same elements as those described in the above embodiment, and the detailed descriptions thereof may be omitted. For example, the semiconductor memory MEM is a ferroelectric memory. In the semiconductor memory MEM, the common word decoder CWDEC differs from that indicated in FIG. 2, and the memory cell arrays ARY in FIGS. 11 and 12 differ from those indicated in FIGS. 4 and 5, respectively. Other configurations are same as those in FIGS. 1 and 3. Namely, the semiconductor memory MEM may be used as, for example, a work memory for an IC card and a radio tag (i.e., RFID), a work memory for a portable device such as a cellular phone and a digital camera, or a work memory for a consumer product such as a video recorder. The semiconductor memory MEM may operate in synchronization with a clock, or may operate asynchronously with a clock. The semiconductor memory MEM may be mounted in, for example, the system SYS as illustrated in FIG. 6.

The common word decoder CWDEC receives signals where the logic of the column address signal CA1-0 are inverted by the selectors SEL0-1. Other configurations of the common word decoder CWDEC are the same as those in FIG. 2. For example, when the column address signal CA1-0 indicates "00" (in binary), the common word decoder CWDEC sets any of the row decode address signal RDA3, RDA7, RDA11, and RDA15 to have a high level in accordance with the row address signal RA3-2. When the column address signal CA1-0 indicates "01" (in binary), the common word decoder CWDEC sets any of the row decode address signal RDA2, RDA6, RDA10, and RDA14 to have a high level in accordance with the row address signal RA3-2. In the same manner, when the column address signal CA1-0 indicates "10", any of the row decode address signal RDA1, RDA5, RDA9, and RDA13 is set to have a high level. When the column address signal CA1-0 indicates "11", any of the row decode address signal RDA0, RDA4, RDA8, and RDA12 is set to have a high level.

Figure 11:
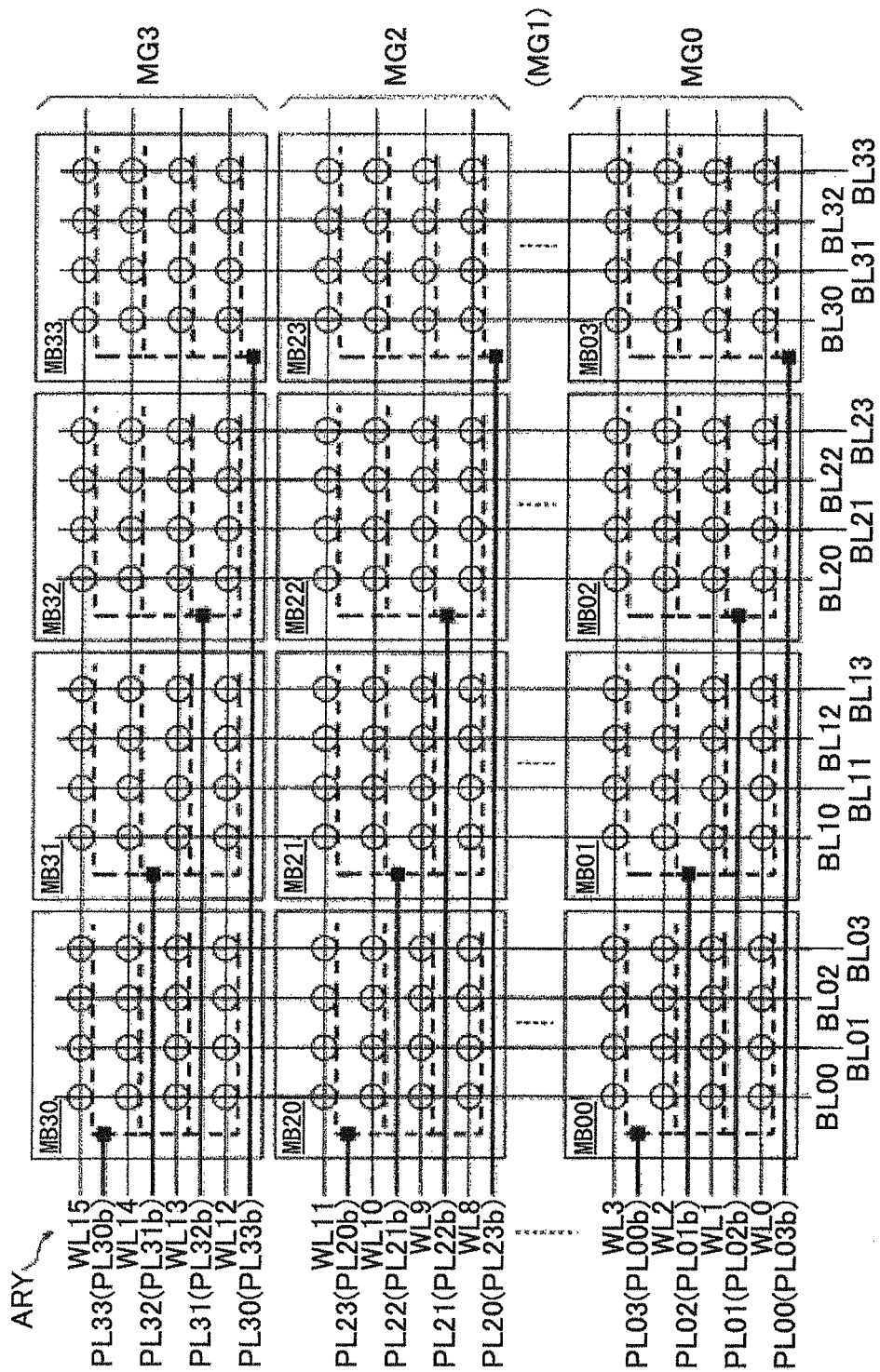
FIG. 11 is an example memory cell array in the semiconductor memory including the common word decoder illustrated in FIG. 10.

FIG. 11 illustrates an example memory cell array ARY in the semiconductor memory MEM including the common word decoder CWDEC indicated in FIG. 10. Detailed descriptions for the configurations similar to those in FIG. 4 are omitted. The layouts of the memory groups MG, the memory blocks MB, the word lines WL, and the bit lines BL are the same as those in FIG. 4. The relationships in the plate lines PL33-30, PL23-20, PL13-10, and PL03-00 are the same. Therefore, in the following, the plate lines PL33-30 are described.

In this embodiment, the logic of the column address signal CA1-0 supplied to the common word decoder CWDEC is inverted. Therefore, for example, the plate PL33 is selected when the column address signal CA1-0 indicates "00". The plate PL32 is selected when the column address signal CA1-0 indicates "01". The plate PL31 is selected when the column address signal CA1-0 indicates "10". The plate PL30 is selected when the column address signal CA1-0 indicates "11". Because of this feature, the plates lines PL33, PL32, PL31, and PL30 are indicated as the symbols (signs) PL30b, PL31b, PL32b, and PL33b. The number part of the symbols (signs) 0b, 1b, 2b, and 3b indicate values (in decimal) of the column address signal CA1-0, and the symbol "b" of the symbols (signs) 0b, 1b, 2b, and 3b denotes the inverse of the logic (i.e., "/"; bar).

The plate lines PL33-30 are coupled to the memory blocks MB having the same values as number part of the symbols PL30b-33b. Because of this feature, the positions of the contacts (black rectangular symbols) differ from those in FIG. 4.

Figure 12:
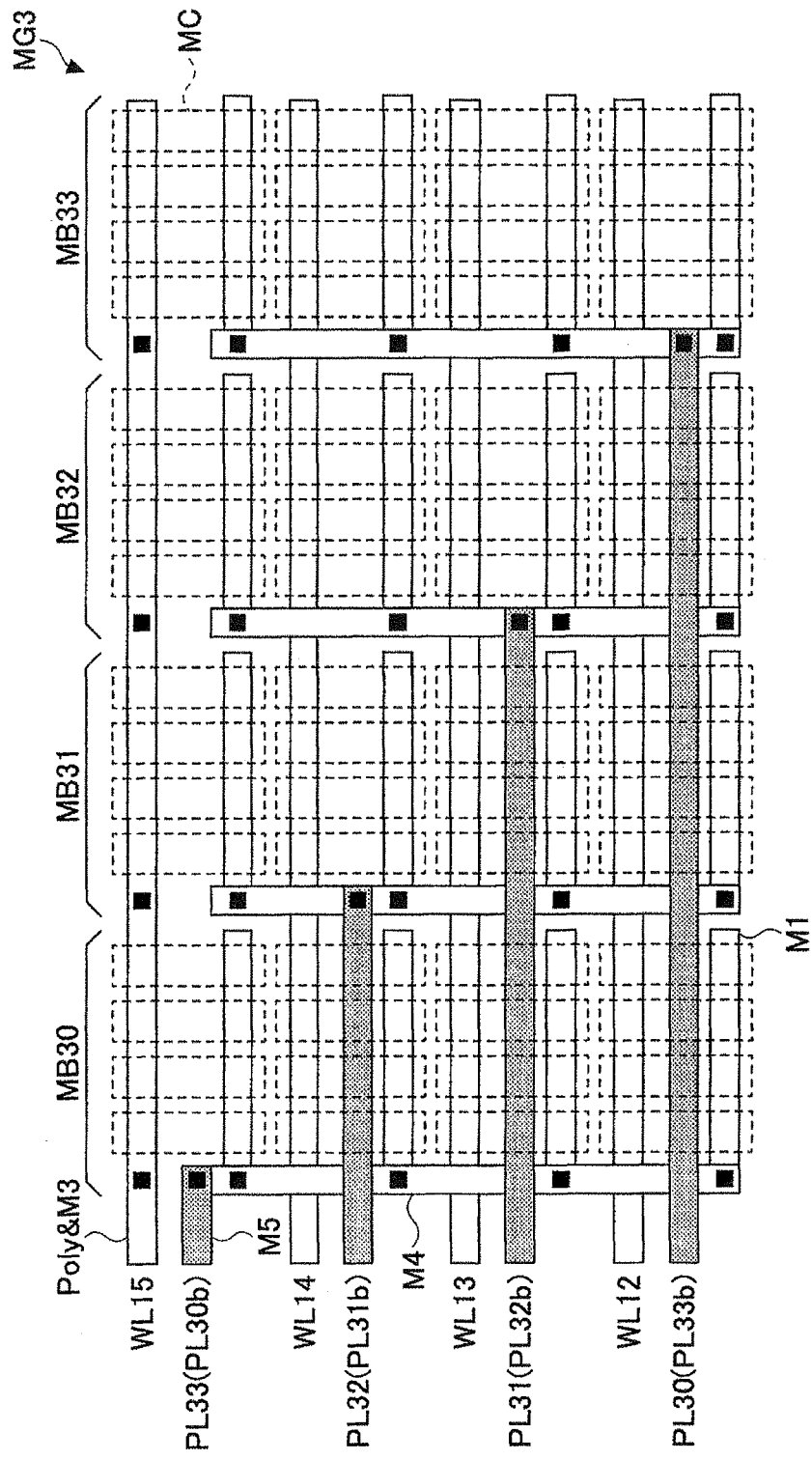
FIG. 12 is an example wiring layout of the memory cell array illustrated in FIG. 11.

FIG. 12 illustrates an example wiring layout of the memory cell array ARY illustrated in FIG. 11. Detailed descriptions of the configurations same as those in FIG. 5 may be omitted. In FIG. 12, similar to FIG. 5, the memory group MG3 (memory blocks MB30-33) is illustrated. Further, to make the wiring of the plate lines PL more evident, the plate lines PL (fifth metal wiring layer M5) wired in the lateral direction of the figure from left end of the memory cell array ARY to the memory blocks MB are indicated by using shaded areas.

As illustrated in FIG. 1, the control signal lines such as the plate activation signal PACTZ are wired in the upward direction in FIG. 1 from the operation control circuit CTRL disposed on the lower right side of the memory cell array ARY to the sub word plate drivers SWPDRV. The sub word plate drivers SWPDRV on the upper side of FIG. 3 receive the plate activation signal PACTZ later than the sub word plate drivers SWPDRV on the lower side of FIG. 3 receive. Therefore, in read operation and in write operation, the plate line PL33 is activated relatively later and the plate line PL30 is activated relatively earlier.

In this embodiment, the plate line PL33 corresponding to the sub word plate driver SWPDRV to which the plate activation signal PACTZ is transmitted later has a shorter length of the shaded area in the lateral direction in FIG. 12 and has smaller load capacity. The plate line PL30 corresponding to the sub word plate driver SWPDRV to which the plate activation signal PACTZ is transmitted earlier has a longer length of the shaded area in the lateral direction in FIG. 12 and has larger load capacity. Therefore, timings when high-level pulses occur in the plate lines PL30-33 may be substantially matched with each other. In other words, the activation timings of the plate line signal PL30-33 may be substantially matched with each other.

As described above, in this embodiment as well, the same effects as those in the previous (first described) embodiment may be obtained. Further, the activation periods (timings) of the plate line signal PL may be substantially matched. Therefore, the operation margin of the semiconductor memory MEM may be improved.

Figure 13:
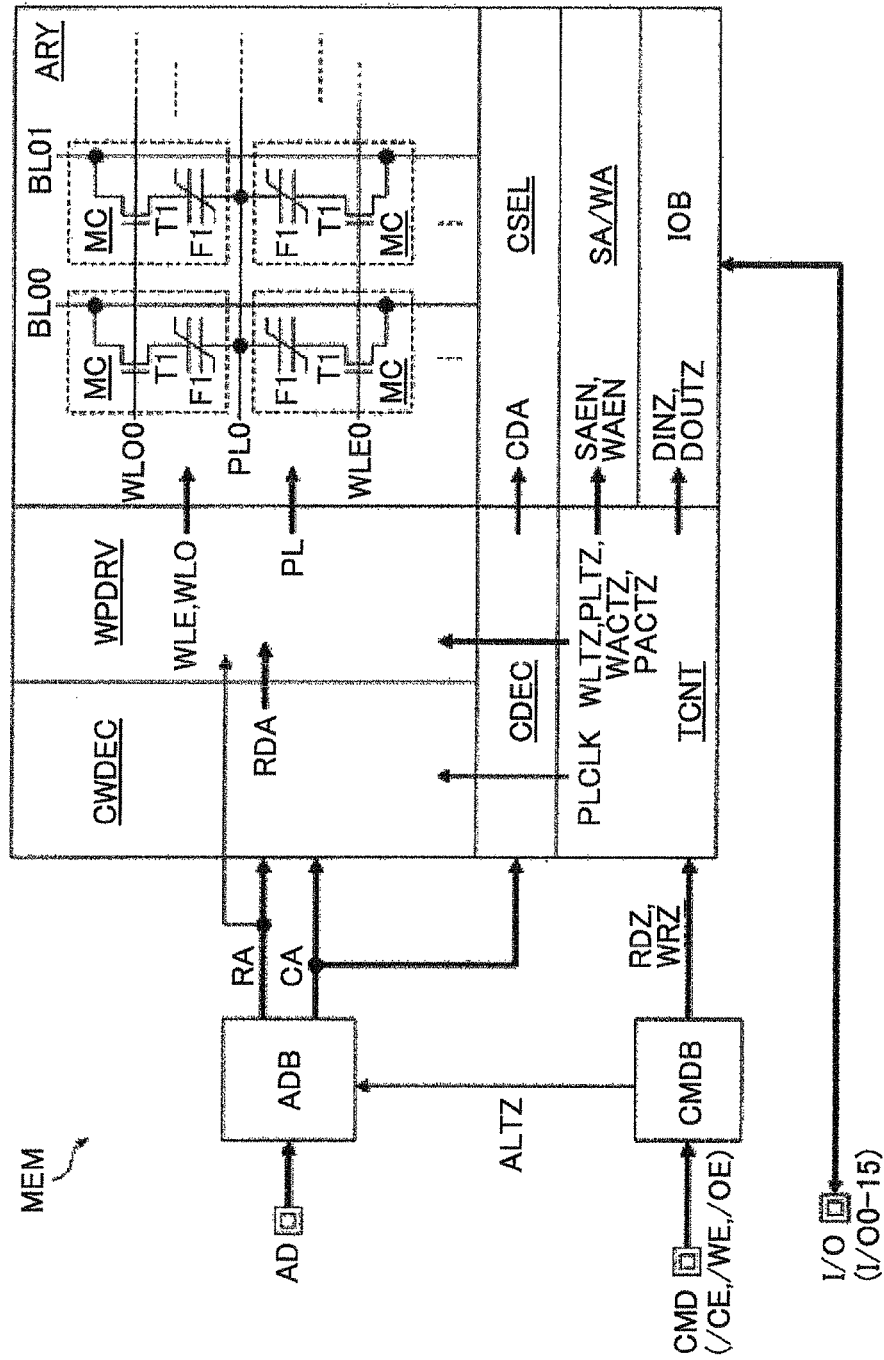
FIG. 13 is an example semiconductor memory according to still another embodiment.

FIG. 13 illustrates an example semiconductor memory MEM according to still another embodiment. Herein, the same signs are used for the same elements as those described in the above embodiments, and the detailed descriptions thereof may be omitted. For example, the semiconductor memory MEM is a ferroelectric memory. Namely, the semiconductor memory MEM may be used as, for example, a work memory for an IC card and a radio tag (i.e., RFID), a work memory for a portable device such as a cellular phone and a digital camera, or a work memory for a consumer product such as a video recorder. The semiconductor memory MEM may operate in synchronization with a clock, or may operate asynchronously with a clock. The semiconductor memory MEM may be mounted in, for example, the system SYS as illustrated in FIG. 6.

In the semiconductor memory MEM, the word plate driver WPDRV and the memory cell array ARY differ from those indicated in FIG. 1. The semiconductor memory MEM receives the row address signal RA having one more bit than that in FIG. 1. Other configurations are the same as those in FIG. 1. The memory cell array ARY of FIG. 13 illustrates a part of the memory block MB00 of FIG. 15. In the memory cell array ARY, each of the plate lines PL is commonly wired to two word lines WLE, WLO. The word plate driver WPDRV selects either the word line WLE or the word line WLO in accordance with, for example, the logic of the uppermost bit of the row address signal RA. The word line WLE or the word line WLO may be selected in accordance with the logic of the lowermost bit of the row address signal RA.

Figure 14:
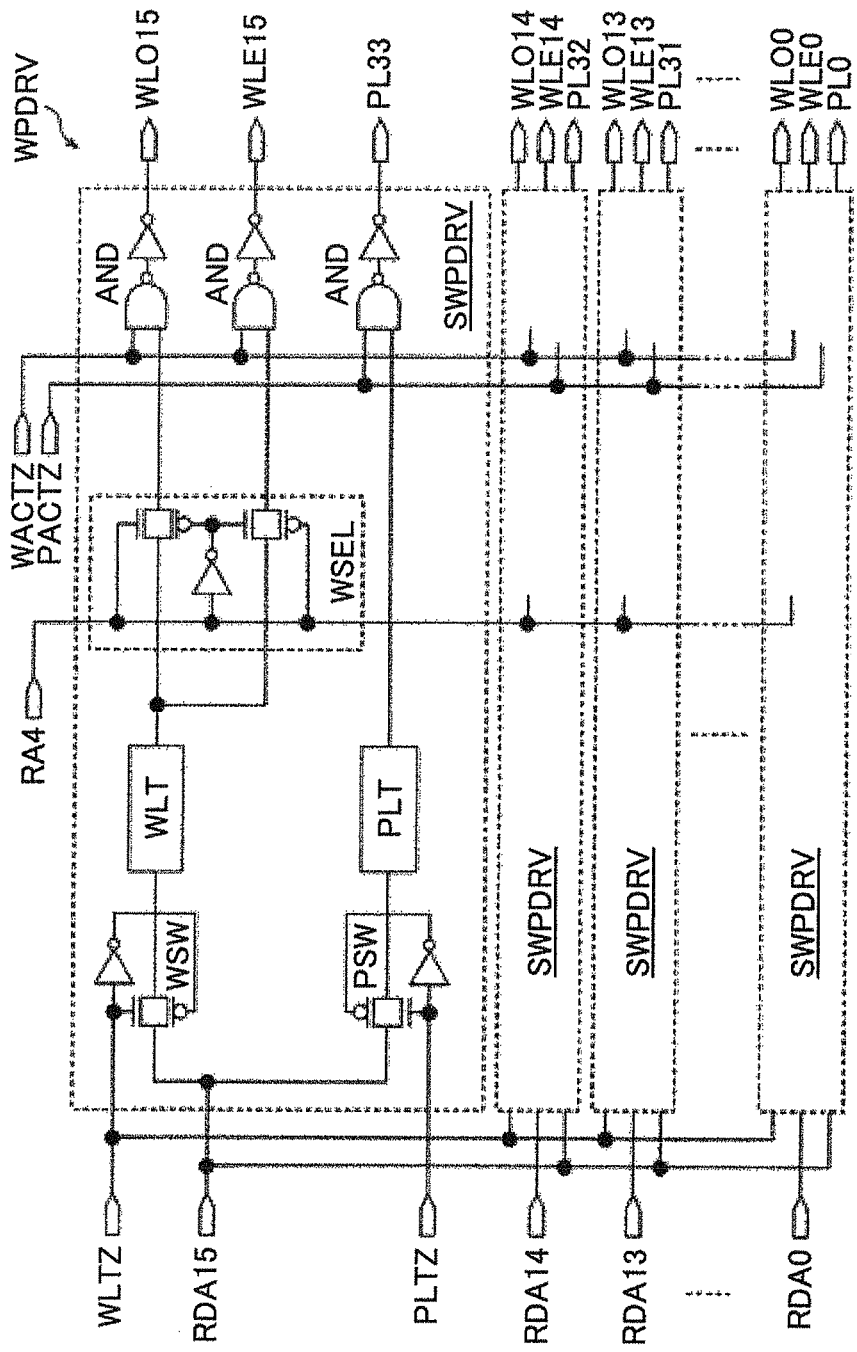
FIG. 14 is an example word plate driver illustrated in FIG. 13.

FIG. 14 illustrates an example word plate driver WPDRV illustrated in FIG. 13. Detailed descriptions of the configurations same as those in FIG. 3 may be omitted. The word plate driver WPDRV includes plural sub word plate drivers SWPDRV each driving a pair of word lines WLE, WLO and one plate line PL. Those sub word plate drivers SWPDRV have the same circuit. Therefore, the sub word plate driver SWPDRV that drives the word lines WLE15, WLO15 and the plate line PL33 is described.

The sub word plate driver SWPDRV further includes a word selector WSEL and an AND circuit when compared with the sub word plate driver SWPDRV illustrated in FIG. 3. For example, the word selector WSEL includes a CMOS transmission gate that is turned ON and OFF in accordance with the logic of the row address signal RA4. When the row address signal RA4 is at a low level, the word selector WSEL couples the output of the latch WLT to the AND circuit coupled to the word line WLE15. When the row address signal RA4 is at a high level, the word selector WSEL couples the output of the latch WLT to the AND circuit coupled to the word line WLO15. The AND circuit coupled to the word lines WLE15, WLO15 operates in synchronization with the word activation signal WACTZ.

In the actual semiconductor memory MEM, for example, the row address signal RA has nine bits (RA0-8) and the column address signal CA has six bits. In this case, the row address signal RA0-7 is supplied to the common word decoder CWDEC, and the row address signal RA8 is supplied to the word selector WSEL.

FIG. 15 illustrates an example memory cell array ARY of FIG. 13. Detailed descriptions of the configurations same as those in FIG. 4 may be omitted. For example, similar to FIG. 4, the memory cell array ARY includes sixteen memory blocks MB (MB00-03, MB10-13, MB20-23, MB30-33). The memory cell array ARY differs from that in FIG. 4 in that each of the memory groups MG and each of the memory blocks MB are coupled to four pairs of the word lines WLE, WLO. Each of the memory blocks MB has 32 memory cells MC. Other configurations are the same as those in FIG. 4.

Herein, to simplify the description, a case is described where each of the bit line groups BL00-03, BL10-13, BL20-23, BL30-33 has four bit lines. Actually, each of the bit line groups has sixteen bit lines BL corresponding to the data terminal I/O0-15. When the data terminal I/O has one bit (I/O0), each of the bit line groups has one bit line.

When the common word decoder CWDEC illustrated in FIG. 2 has three selectors SEL, as described above, each of the memory groups has eight memory blocks. The column selector CSEL receives the row address signal RA0-2 or the column address signal CA0-2 in accordance with the plate selection signal PLCLK. In read operation or in write operation, any of eight memory blocks MB in one memory group MG is selected in accordance with the column address signal CA0-2.

Each of the memory blocks MB is coupled to sixteen word lines WL (eight pairs of word lines WLE, WLO). On eight memory blocks MB of each of the memory groups MG, eight plate lines PL are wired to be coupled to the respective eight memory blocks MB. When the row address signal RA has nine bits (RA0-8), the memory cell array ARY includes 512 word lines (256 pairs of word lines WLE, WLO). Sixteen word lines WL are coupled to each of the memory blocks MB. Therefore, eight memory blocks are arranged in the vertical direction of the figure. Namely, the number of the memory groups MG is eight. A total number of the memory blocks MB is 256 (8 in lateral by 8 in vertical) which is equal to the number of the plate lines and the number of the pairs of the word lines (WLE, WLO).

As illustrated in FIG. 15, when each of the plate lines PL is commonly wired to two word lines WLE, WLO, the memory blocks MB of the number of m-th power of 2 ($2.\sup.m$) are arranged along the word lines WL (in the lateral direction of the figure) (m: the number of the selectors SEL). The plate line PL is wired to each of the memory blocks MB. Each of the memory groups MG and each of the memory blocks MB are coupled to the word lines (WLE, WLO) of the number of pairs of m-th power of 2 ($2.\sup.m$). When the number of bits of the row address signal RA supplied to the common word decoder CWDEC is n, the number of pairs of the word lines (WLE, WLO), the number of plate lines PL, and the number of memory blocks MB are equal to the number of (n−1)-th power of 2 ($2.\sup.(n-1)$). The number of the memory groups MG is the number of (n−1−m)-th power of 2 ($2.\sup.(n-1-m)$).

As described above, in this embodiment as well, the same effects as those in the previously described embodiments may also be obtained. Further, in the semiconductor memory MEM where each of the plate lines PL is commonly coupled to a pair of word lines WLE, WLO, the circuit scale of the common word decoder CWDEC may also be reduced. Further, the number of the row decode address signal lines RDA may be reduced, and the size of the wiring region of the signal lines may be reduced. As a result, the chip size of the semiconductor memory MEM may be reduced.

Further, as illustrated in FIG. 10, a signal having the inverted logic of the column address signal CA0-1 may be supplied to the common word decoder CWDEC illustrated in FIG. 13. In this case, the memory cell array ARY (FIG. 15) is changed similar to that of FIG. 11. Namely, the plate line PL33 is coupled to the memory block MB30, and the plate line PL32 is coupled to the memory block MB31. The plate line PL31 is coupled to the memory block MB32, and the plate line PL30 is coupled to the memory block MB33. This similarly applies to the plate lines PL00-03, PL10-13, and PL20-23. By doing this, the activation timings of the plate lines PL may be substantially matched with each other.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiment of the present invention has been described in detail, it is to be understood that various changes, substitutions, and alterations could be made hereto without departing from the sprit and scope of the invention.

What is claimed is:

1. A semiconductor memory comprising:
   memory cells;
   word lines coupled to the memory cells;
   plate lines coupled to the memory cells;
   a selector that selects a first address signal in a first period and selects a second address signal in a second period;

a decode circuit that sequentially decodes the first and the second address signals selected by the selector, sequentially generates decode address signals based on the decoded first and second address signals, and sequentially activates the generated decode address signals; and a driver circuit that drives one of the word lines in accordance with one of the decode address signals activated based on the first address signal and drives one of the plate lines in accordance with the one of the decode address signals activated based on the second address signal.

2. The semiconductor memory according to claim 1,
wherein the decode circuit is configured to further decode a third address signal, generate the decode address signals based on the decoded first, second, and third address signals, and sequentially activate any of the generated decode address signals, and
wherein the driver circuit is configured to drive the one of the word lines in accordance with the one of the decode address signals activated based on the first and the third address signals and drive the one of the plate lines in accordance with the one of the decode address signals activated based on the second and the third address signals.

3. The semiconductor memory according to claim 2, further comprising:
memory groups determined based on the third address signal; and
memory blocks that are provided in each of the memory groups and determined based on the second address signal, each of the memory blocks including the memory cells,
wherein the plate lines are wired to the memory blocks, and
wherein the word lines determined based on the first address signal are commonly wired to the memory blocks in the memory group in each of the memory groups.

4. The semiconductor memory according to claim 3,
wherein a number of the word lines is equal to a number of the memory blocks.

5. The semiconductor memory according to claim 2, further comprising:
bit lines coupled to the memory cells,
wherein the first and the third address signals are configured to indicate a row address, and
wherein the second address signal is configured to indicate a column address.

6. The semiconductor memory according to claim 2,
wherein the driver circuit includes plural sub driver circuits, each of the plural sub driver circuits receiving the decode address signals and being coupled to one of the word lines and one of the plate lines, and
wherein each of the plural sub driver circuits includes
a first latch circuit configured to latch a level of a corresponding decode address signal in synchronization with a first timing signal,
a first activation circuit configured to activate the word line in synchronization with a second timing signal when the first latch circuit latches an activation level of the corresponding decode address signal,
a second latch circuit configured to latch a level of a corresponding decode address signal in synchronization with a third timing signal, and
a second activation circuit configured to activate the plate line in synchronization with a fourth timing signal when the second latch circuit latches an activation level of the corresponding decode address signal.

7. The semiconductor memory according to claim 6, further comprising:
an operation control circuit configured to change a level of a selection signal from a first level to a second level, generate the first timing signal while the selection signal is at the first level, and generate the second, the third, and the fourth timing signals while the selection signal is at the second level after a certain time period has passed since a receipt of a read command or a write command,
wherein the selector is configured to select the first address signal while the selection signal is at the first level and select the second address signal while the selection signal is at the second level.

8. The semiconductor memory according to claim 1, further comprising:
an operation control circuit configured to change a level of a selection signal from a first level to a second level after a certain time period has passed since a receipt of a read command or a write command,
wherein the selector is configured to select the first address signal while the selection signal is at the first level and select the second address signal while the selection signal is at the second level.

9. The semiconductor memory according to claim 1,
wherein the decode circuit is configured to decode the first and the second address signals and a third address signal commonly used to select the word line and the plate line and activate any of the decode address signals,
wherein the driver circuit is configured to drive one of a pair of the word lines in accordance with a fourth address signal, the pair of the word lines are selected in accordance with the one of the decode address signals activated based on the first and a third address signals, and drive the plate line in accordance with the one of the decode address signals activated based on the second and the third address signals.

10. The semiconductor memory according to claim 9,
wherein the driver circuit includes plural sub driver circuits, each of the plural sub driver circuits receiving the decode address signal and being coupled to two of the word lines and one of the plate lines, and
wherein each of the plural sub driver circuits includes
a first latch circuit configured to latch a level of a corresponding decode address signal in synchronization with a first timing signal,
a pair of first activation circuits coupled to the two of the word lines,
a word selector configured to connect an output of the first latch circuit to one of the first activation circuits in accordance with the fourth address signal,
a second latch circuit configured to latch a level of a corresponding decode address signal in synchronization with a third timing signal, and
a second activation circuit configured to activate the plate line in synchronization with a fourth timing signal when the second latch circuit latches an activation level of the corresponding decode address signal, and
wherein each of the pair of first activation circuits is configured to activate the corresponding word line in synchronization with a second timing signal while receiving the output from the first latch circuit via the word selector, and the first latch circuit is configured to latch an activation level of the corresponding decode address signal.

11. A method for operating a semiconductor memory including memory cells, word lines coupled to the memory cells, and plate lines coupled to the memory cells, the method comprising:

selecting a first address signal to select one of the word lines in a first period;

selecting a second address signal to select one of the plate lines in a second period;

sequentially decoding the selected first and the second address signals;

sequentially generating first decode address signals based on the decoded first and second address signals;

sequentially activating any of the generated first decode address signals;

driving the one of the word lines in accordance with one of the first decode address signals activated based on the first address signal; and driving the one of the plate lines in accordance with the one of the first decode address signals activated based on the second address signal.

12. The method according to claim 11, further comprising:

sequentially decoding a third address signal;

sequentially generating second decode address signals based on the decoded first, second, and third address signals;

sequentially activating any of the generated second decode address signals;

driving the one of the word lines in accordance with one of the second decode address signals activated based on the first and the third address signals; and driving the one of the plate lines in accordance with the one of the second decode address signals activated based on the second and the third address signals.

13. The method according to claim 12, wherein the semiconductor memory includes bit lines coupled to the memory cells, and wherein the first and the third address signals are configured to indicate a row address to select the one of the word lines and the second address signal is configured to indicate a column address to select one of the bit lines.

14. The semiconductor memory according to claim 5, wherein the driver circuit includes plural sub driver circuits, each of the plural sub driver circuits receiving the decode address signals and being coupled to one of the word lines and one of the plate lines, and wherein each of the plural sub driver circuits includes a first latch circuit configured to latch a level of a corresponding decode address signal in synchronization with a first timing signal, a first activation circuit configured to activate the word line in synchronization with a second timing signal when the first latch circuit latches an activation level of the corresponding decode address signal, a second latch circuit configured to latch a level of a corresponding decode address signal in synchronization with a third timing signal, and a second activation circuit configured to activate the plate line in synchronization with a fourth timing signal when the second latch circuit latches an activation level of the corresponding decode address signal.

* * * * *